United States Patent
Kahlman et al.

(10) Patent No.: US 7,158,060 B2
(45) Date of Patent: *Jan. 2, 2007

(54) MODULATION APPARATUS/METHOD, DEMODULATION APPARATUS/METHOD AND PROGRAM PRESENTING MEDIUM

(75) Inventors: Josephus A. H. M. Kahlman, Eindhoven (NL); Kornelis A. Schouhamer Immink, Eindhoven (NL); Gijsbert J. Van Den Enden, Veldhoven (NL); Toshiyuki Nakagawa, Tokyo (JP); Yoshihide Shinpuku, Tokyo (JP); Tatsuya Narahara, Tokyo (JP); Kosuke Nakamura, Tokyo (JP)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/335,806

(22) Filed: Jan. 19, 2006

(65) Prior Publication Data

US 2006/0132342 A1 Jun. 22, 2006

Related U.S. Application Data

(63) Continuation of application No. 09/320,812, filed on May 27, 1999, now Pat. No. 6,496,541, and a continuation of application No. 10/263,079, filed on Oct. 2, 2002, now Pat. No. 6,677,866, and a continuation of application No. 10/704,277, filed on Nov. 7, 2003.

(30) Foreign Application Priority Data

May 29, 1998 (JP) .................. 98-150280

(51) Int. Cl.
*H03M 7/40* (2006.01)

(52) U.S. Cl. .................. 341/67; 341/59; 341/95; 375/253

(58) Field of Classification Search ............. 341/67, 341/61, 59, 95, 253; 360/41; 375/242, 243; 369/47.19, 59.24
See application file for complete search history.

(56) References Cited

U.S. PATENT DOCUMENTS

| | | | |
|---|---|---|---|
| 3,773,975 A | 11/1973 | Koziol | |
| 5,333,126 A | 7/1994 | Fukuda et al. | 369/59 |
| 5,477,222 A | 12/1995 | Kahlman | |
| 5,659,577 A | 8/1997 | Ohishi | 375/242 |
| 5,881,037 A | 3/1999 | Tanaka et al. | 369/48 |
| 5,917,857 A | 6/1999 | Tanaka et al. | 375/243 |
| 5,978,419 A | 11/1999 | Cassiday | |
| 6,072,756 A | 6/2000 | Shigenobu | 369/47 |
| 6,079,041 A | 6/2000 | Kunisa et al. | 714/752 |
| 6,175,318 B1 | 1/2001 | Kahlman | |
| 6,198,710 B1 | 3/2001 | Hori et al. | 369/59 |
| 6,275,175 B1 | 8/2001 | Kahlman | |
| 6,496,541 B1 | 12/2002 | Kahlman et al. | 375/253 |

FOREIGN PATENT DOCUMENTS

| EP | 0902544 A2 | 3/1999 |
|---|---|---|
| EP | 0903864 A2 | 3/1999 |

OTHER PUBLICATIONS

Z. Keirn et al., "Experimental Performance Comparison of FDTS/DF Detectors: 8/9 (0,k) vs. 4/5 MTR Codes", IEEE Transactions of Magnetics, vol. 33, No. 5, Sep. 1997, pp. 27.
J. Moon et al., "Maximum Transition Run Codes for Data Storage Systems", IEEE Transactions on Magnetics, vol. 32, No. 5, Sep. 1996, pp. 3992-3994.

*Primary Examiner*—Jean Bruner Jeanglaude
(74) *Attorney, Agent, or Firm*—Michael E. Belk

(57) ABSTRACT

How to record and play back data at a high line density. A DSV control bit determining/inserting unit 11 inserts DSV control bits for execution of DSV control into an input data string and outputs the data string including the DSV control bits to a modulation unit 12. The modulation unit 12

MODULATION APPARATUS 1 converts the data string with a basic data length of 2 bits into variable length code with a basic code length of 3 bits in accordance with a conversion table and outputs the code resulting from the conversion to a NRZI encoding unit 13. The conversion table used by the modulation unit 12 includes substitution codes for limiting the number of consecutive appearances of a minimum run to a predetermined value and substitution codes for keeping a run length limit.

In addition, the conversion table enforces a conversion rule, according to which the remainder of division of the "1" count of an element in a data string by 2 having a value of 0 or 1 shall always be equal to the remainder of division of the "1" count of an element in the code resulting from conversion of the data string by 2.

35 Claims, 7 Drawing Sheets

MODULATION APPARATUS/METHOD, DEMODULATION APPARATUS/METHOD AND PROGRAM PRESENTING MEDIUM

CROSS REFERENCE TO RELATED APPLICATION

This is a continuation of prior application Ser. No. 09/320,812 filed May 27, 1999, granted (U.S. Pat. No. 6,496,541) and prior application Ser. No. 10/263,079 filed Oct. 2, 2002, granted (U.S. Pat. No. 6,677,866), and prior application Ser. No. 10/704,277 filed Nov. 7, 2003, allowed.

DETAILED DESCRIPTION OF THE INVENTION

1. Technical Field of the Invention

In general, the present invention relates to a modulation apparatus and a modulation method, a demodulation apparatus and a demodulation method as well as a program presenting medium. More particularly, the present invention relates to a preferable modulation apparatus and a preferable modulation method, a preferable demodulation apparatus and a preferable demodulation method as well as a preferable program presenting medium used in operations to record data onto a recording medium at a high recording density and playback data recorded in a recording medium at a high recording density.

2. Prior Art

When data is transmitted through a transmission line or recorded onto a recording medium such as a magnetic disc, an optical disc or a magneto-optic disc, the data is modulated into code matching the transmission line or the recording medium prior to the transmission or recording. As a technique of modulation, block encoding is known. In the block encoding, a data string is blocked into units each comprising m×i bits. Each of the units which is referred to hereafter as a data word is then converted into a code word comprising n×i bits in conformity with a proper coding rule. For i=1, this code word is a fixed length code. In the case of i having a plurality of values each selected from the range 1 to imax, a maximum of i, the resulting code word is a variable length code. In general, a code resulting from the block encoding is expressed as a variable length code (d, k; m, n; r).

Here, i is called a constraint length and r is imax, a maximum constraint length. d is the minimum number of 0s appearing between two consecutive 1s. d is referred to as a minimum run of 0s. On the other hand, k is the maximum number of 0s appearing between two consecutive 1s. k is referred to as a maximum run of 0s.

By the way, in an operation to record variable length code obtained from the block encoding described above onto a recording medium such as an optical disc or a magneto-optic disc, for example, on to a compact disc (CD) or a minidisc (MD), the variable length code undergoes an NRZI (Non Return to Zero Inverted) modulation wherein each "1" of the variable length code is interpreted as inversion while a "0" is interpreted as non-inversion The variable length code completing the NRZI modulation is then recorded. The variable length code completing the NRZI modulation is referred to as a recording wave train. In the case of a magneto-optic disc conforming to the early ISO specifications prescribing a not so large recording density, a train of bits completing recording modulation are recorded as they are without undergoing the NRZI modulation.

Let notations Tmin and Tmax denote the minimum and maximum inversion periods of a recording wave train respectively. In this case, in order to record the recording wave train at a high recording density in the linear speed direction, a long minimum inversion period Tmin or a large minimum run d is preferred. In addition, from the clock generation point of view, it is desirable to have a short maximum inversion period Tmax or a small maximum run k. In order to satisfy these requirements, a variety of modulation techniques have been proposed.

To put it concretely, for an optical disc, a magnetic disc or a magneto-optic disc, there are proposed or actually used modulation techniques for generating a variable length code RLL (1-7) which is also expressed as (1, 7; m, n; r) and a variable length code RLL (2-7) also expressed as (2, 7 m, n; r) as well as a fixed length code RLL (1-7) also expressed as (1, 7; m, n; 1) used in an ISO specification MO. As for a disc apparatus currently under research and development such as an optical disc and a magneto-optic disc having a high recording density, an RLL code (Run length Limited Code) with a minimum run d of 1 is commonly used.

The following is an example of a conversion table of the variable length RLL (1 7) code.

TABLE 1

| RLL (1, 7; 2, 3; 2) | | |
|---|---|---|
| Data | Code | |
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |

The symbol x used in the conversion table has the value "1" for a next following channel bit of "0" or has the value "00" for a next following channel bit of "1". The maximum constraint length r is 2.

Parameters of the variable length code RLL (1-7) are (1, 7; 2, 3; 2). The minimum inversion period Tmin which can be expressed by (d+1) T is thus equal to 2 (=1+1) T where T is a bit gap in the recording wave train. The minimum inversion period Tmin which can be expressed also by (m/n)×2 Tdata is thus equal to 1.33 (=⅔×2) Tdata where Tdata is a bit gap in the data string. The maximum inversion period Tmax which can be 1.0 expressed by (k+1) T is thus equal to (7+1) T=8T=8×(m/n) Tdata=8×⅔Tdata=5.33 Tdata. The detection window width Tw which can be expressed also by (m/n) Tdata is thus equal to 0.67 (=⅔) Tdata.

By the way, in a train of channel bits completing the RLL (1-7) modulation shown in Table 1, a generation frequency corresponding to a period of 2T which is equal to the minimum inversion period Tmin is most observed to be followed by generation frequencies corresponding to periods of 3T and 4T. The fact that a lot of edge information is generated at short intervals such as 2T and 3T is advantageous to the generation of a clock signal in many cases.

As the recording line density is further increased, however, the minimum run this time adversely becomes a problem. That is, if minimum runs 2T are generated consecutively, the recording wave train is prone to distortion generated therein. This is because a 2T wave output is smaller than other wave outputs and, hence, easily affected by factors such as a defocus and a tangential tilt. In addition, at a high line density, recording of consecutive minimum marks (2T) is also easily affected by disturbances such as noise. Thus, an operation to play back the data will also be prone to errors. In this case, a pattern of errors in reproduction of the data is observed as shifts of the front and rear edges of a minimum mark in many cases. As a result, the length of the generated bit error increases.

As described above, when data is transmitted through a transmission line or recorded onto a recording medium, the data is modulated into code matching the transmission line or the recording medium prior to the transmission or recording. If the code resulting from the modulation contains a direct current component, a variety of error signals such as tracking errors generated in control of a servo of the disc drive become prone to variations or jitters are generated easily. For this reason, it is thus desirable to make as many efforts to prevent the modulated code from containing a direct current component as possible.

In order to prevent the modulated code from containing a direct current component, control of a DSV (Digital Sum Value) to prevent the modulated code from containing a direct current component has been proposed. The DSV is a total found by adding up the values of a train of bits (symbols of data), wherein the values +1 and −1 are assigned to "1" and "0" in the train respectively, which results from NRZI modulation (that is, level encoding) of a train of channel bits. The DSV is an indicator of a direct current component contained in a train of codes. Decreasing the absolute value of the DSV through DSV control is equivalent to suppressing the magnitude of a direct current component contained in a train of codes.

DSV control is not applied to a modulation code generated in accordance with the variable length RLL (1-7) table shown as Table 1 given above. DSV control for such a case is accomplished by calculating a DSV of a train of encoded bits (a train of channel bits) after the modulation for a predetermined period of time and inserting a predetermined number of DSV control bits into the train of encoded bits (the train of channel bits).

At any rate, the DSV control bits are basically redundant bits. If the efficiency of the code conversion is to be taken into consideration, it is thus desirable to reduce the number of DSV control bits to a smallest possible value.

In addition, if DSV control bits are inserted, it is also desirable to make the minimum run d and the maximum run k unchanged. This is because a change in (d, k) will have an effect on recording/playback characteristics.

Problems to be Solved by the Invention

As described above, in an operation to record RLL code at a high line density or an operation to play back RLL code recorded at a high line density, there is raised a problem that a pattern of consecutive minimum runs d will cause a long error to be generated easily.

In addition, in the case of RLL code such as the RLL (1-7) code, DSV control necessitates insertion of DSV control bits into an arbitrary part of a string of code words (a train of channel bits). Since the DSV control bits are basically redundant bits, however, it is desirable to reduce the number of inserted DSV control bits to a smallest possible value. In order to keep the minimum run and the maximum run at constant values, however, the number of DSV control bits is at least 2. It is thus desirable to reduce the number of DSV control bits to an even smaller value.

The present invention addresses the problems described above. It is an object of the present invention to allow DSV control to be executed for producing high efficiency control bits on RLL code of (d, k; m, n) where the minimum run d=1, that is RLL code of (1, 7; 2, 3) so that the number of consecutive minimum runs is reduced while the minimum run and the maximum run are being kept.

It is another object of the present invention to prevent propagation of a demodulation error from escalating by using a conversion table having a simplest possible configuration.

Means for Solving the Problems

A modulation apparatus according to claim 1 is characterized by having conversion means for converting input data into code in accordance with a conversion table wherein said conversion table enforces a conversion rule, according to which the remainder of division of a '1' count of an element in a data string by 2 having a value of 0 or 1 shall always be equal to the remainder of division of a '1' count of an element in the string of code words resulting from conversion of said data string by 2 and conversion codes of said conversion table comprise:

basic codes for d=1, k=7, m=2 and n=3 where d is a minimum run and k is a run length limit;

first substitution codes for limiting the number of consecutive appearances of said minimum run d; and second substitution codes for keeping said run length limit k.

A modulation method according to claim 23 is characterized by including a conversion step of converting input data into code in accordance with a conversion table wherein said conversion table enforces a conversion rule, according to which the remainder of division of a '1' count of an element in a data string by 2 having a value of 0 or 1 shall always be equal to the remainder of division of a '11 count of an element in the string of code words resulting from conversion of said data string by 2 and conversion codes of said conversion table comprise:

basic codes for d=1, k=7, m=2 and n=3 where d is a minimum run and k is a run length limit;

first substitution codes for limiting the number of consecutive appearances of said minimum run d; and second substitution codes for keeping said run length limit k.

A program presenting medium according to claim 24 for presenting a program implementing processing including a conversion step of converting input data into code in accordance with a conversion table data in a modulation apparatus for converting data with a basic data length of m bits into variable length code (d, k; m, n; r) with a basic code length of n bits is characterized in that said conversion table enforces a conversion rule, according to which the remainder of division of a '1' count of an element in a data string by 2 having a value of 0 or 1 shall always be equal to the remainder of division of a '1' count of an element in the string of code words resulting from conversion of said data string by 2 and conversion codes of said conversion table comprise:

basic codes for d=1, k=7, m=2 and n=3 where d is a minimum run and k is a run length limit;

first substitution codes for limiting the number of consecutive appearances of said minimum run d; and second substitution codes for keeping said run length limit k.

A demodulation apparatus according to claim 25 is characterized by having conversion means for converting input code into data in accordance with a conversion table wherein said conversion table enforces a conversion rule, according to which the remainder of division of a '1' count of an element in a data string by 2 having a value of 0 or 1 shall always be equal to the remainder of division of a '1' count of an element in the string of code words resulting from conversion of said data string by 2 and conversion codes of said conversion table comprise:

basic codes for d=1, k=7, m=2 and n=3 where d is a minimum run and k is a run length limit;

first substitution codes for limiting the number of consecutive appearances of said minimum run d; and second substitution codes for keeping said run length limit k.

A demodulation method according to claim 28 is characterized by having a conversion step of converting input code into data in accordance with a conversion table wherein said conversion table enforces a conversion rule, according to which the remainder of division of a '1' count of an element in a data string by 2 having a value of 0 or 1 shall always be equal to the remainder of division of a '1' count of an element in the string of code words resulting from conversion of said data string by 2 and conversion codes of said conversion table comprise:

basic codes for d=1, k=7, m=2 and n=3 where d is a minimum run and k is a run length limit;

first substitution codes for limiting the number of consecutive appearances of said minimum run d; and second substitution codes for keeping said run length limit k.

A program presenting medium according to claim 29 for presenting a program including a conversion step of converting input code into data in accordance with a conversion table in a demodulation apparatus for converting variable length code (d, k; m, n; r) with a basic code length of n bits into data with a basic data length of m bits is characterized in that said conversion table enforces a conversion rule, according to which the remainder of division of a '1' count of an element in a data string by 2 having a value of 0 or 1 shall always be equal to the remainder of division of a '1' count of an element in the string of code words resulting from conversion of said data string by 2 and conversion codes of said conversion table comprise:

basic codes for d=1, k=7, m=2 and n=3 where d is a minimum run and k is a run length limit;

first substitution codes for limiting the number of consecutive appearances of said minimum run d; and second substitution codes for keeping said run length limit k.

According to the modulation apparatus claimed as claim 1, the modulation method claimed as claim 23, the program presenting medium claimed as claim 24, the demodulation apparatus claimed as claim 25, the demodulation method claimed as claim 28 and the program presenting medium claimed as claim 29, conversion processing is carried out on the basis of a conversion table enforcing a conversion rule, according to which the remainder of division of a '1' count of an element in a data string by 2 having a value of 0 or 1 shall always be equal to the remainder of division of a '1' count of an element in the string of code words resulting from conversion of the data string by 2 and conversion codes of the conversion table comprising:

basic codes for d=1, k=7, m=2 and n=3;

first substitution codes for limiting the number of consecutive appearances of the minimum run d; and second substitution codes for keeping the run length limit.

DETAILED DESCRIPTION OF THE PREFERRED EMBODIMENTS

Before starting the explanation of some preferred embodiments of the present invention, in order to clarify relations associating means of the present invention described in the claims with implementations adopted in the embodiments, in the following description characterizing the invention, each of the means is followed by a typical implementation enclosed in parentheses in the form "a means (implemented for example by a typical implementation)". It is needless to say, however, that the typical implementation is not intended to be construed in a limiting sense. That is, a means is not necessarily limited to a typical implementation associated with the means.

A modulation apparatus according to claim 1 is characterized by having conversion means (implemented for example by a modulation unit shown in FIG. 12) for converting input data into code in accordance with a conversion table (implemented for example by Table 2) wherein said conversion table enforces a conversion rule, according to which the remainder of division of a '1' count of an element in a data string by 2 having a value of 0 or 1 shall always be equal to the remainder of division of a '1' count of an element in the string of code words resulting from conversion of said data string by 2 and conversion codes of said conversion table comprise:

basic codes for d=1, k=7, m=2 and n=3 where d is a minimum run and k is a run length limit;

first substitution codes for limiting the number of consecutive appearances of said minimum run d; and second substitution codes for keeping said run length limit k.

According to claim 10, the modulation apparatus claimed as claim 10 is further characterized by further having a synchronization signal inserting means (implemented for example by a synchronization signal inserting unit 212 shown in FIG. 9) for inserting a synchronization signal including a unique pattern not included in said conversion codes of said conversion table into any arbitrary position in said string of code words.

According to claim 21, the modulation apparatus claimed as claim 1 is further characterized by further having DSV control means (implemented f or example by a DSV control bit determining/inserting unit 11 shown in FIG. 1) for controlling DSVs of input data and supplying said DSVs to said conversion means.

According to claim 22, the modulation apparatus claimed as claim 1 is further characterized in that said conversion means comprises:

a first code detecting means (implemented for example by a minimum run consecutive appearance limiting code detecting unit 33 shown in FIG. 3) for detecting said first substitution codes for limiting the number of consecutive appearances of said minimum run d; and a second code detecting means (implemented for example by a maximum run assuring code detecting means 34 shown in FIG. 3) for detecting said second substitution codes for keeping run length limit.

A demodulation apparatus according to claim 25 is characterized by having conversion means (implemented for example by a demodulation unit 111 shown in FIG. 5) for converting input code into data in accordance with a conversion table wherein said conversion table (implemented for example by Table 2) enforces a conversion rule, according to which the remainder of division of a '1' count of an element in a data string by 2 having a value of 0 or 1 shall always be equal to the remainder of division of a '1' count of an element in the string of code words resulting from conversion of said data string by 2 and conversion codes of said conversion table comprise:

basic codes for d=1, k=7, m=2 and n=3 where d is a minimum run and k is a run length limit;

first substitution codes for limiting the number of consecutive appearances of said minimum run d; and second substitution codes for keeping said run length limit k.

According to claim 26, a demodulation apparatus claimed as claim 25 is further characterized by further having a bit removing means (implemented for example by a DSV control bit removing unit 112 shown in FIG. 5) for removing redundant bits inserted at predetermined intervals into said code.

Preferred embodiments of the present invention are described as follows. In order to make the explanation easy to understand, in the following description, an array of bits '0' and '1' of data prior to conversion, that is, a pre-conversion data string, is represented as a train of bits enclosed in parentheses ( ) like for example (000011). On the other hand, an array of bits '0' and '1' of a code resulting from the conversion, that is, a string of post-conversion string words is represented as a train of bits delimited by a pair of symbols "like for example "000100100". Tables 2 and 3 given below are examples of a conversion table for converting data into a code in accordance with the present invention.

TABLE 2

17PP.RML.32

| Data | Code |
|------|------|
| 11 | *0* |
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| "110111 | 001 000 000 (next 010) |
| 00001000 | 000 100 100 100 |
| 00000000 | 010 100 100 100 | if xx1 then *0* = 000
xx0 then *0* = 101 sync & Termination

01 000 000 001 (12 channel bits)
or
01 001 000 000 001 000 000 001 (24 channel bits)
# = 0: Not terminate case
# = 1: Terminate case Termination Table

| 00 | 000 | |
| 0000 | 010 | 100 |
| "110111 | 001 000 000 (next 010) | |

When next channel bits are '010' convert '11 01 11' into '001 000 000' after using the main table and the termination table. As shown in Table 2, the conversion table shows codes resulting from conversion including basic codes, substitution codes and termination codes. Conversion processing can not be carried out without a basic code. In the conversion table, the basic codes are the codes resulting from conversion of the data strings (1) to (000000). Conversion processing can be performed even if a substitution code does not exist. If a substitution code exists, however, more effective conversion processing can be carried out. In the conversion table, the substitution codes are the codes resulting from conversion of the data strings (110111), (00001000) and (00000000). The termination code is used for terminating code resulting from conversion at any arbitrary position. The termination codes in the table are the codes resulting from conversion of the data strings (00) and (0000). In addition, the conversion table also prescribes synchronization signals.

In Table 2, the minimum run d is 1 whereas the maximum run k is 7. One of the elements of the basic codes include an indeterminate code, that is, a code indicated by the asterisk symbol '*'. The bit represented by the symbol '*' of the indeterminate code can be determined to be either "0" or; "1", in order to keep the values of the minimum run d and the maximum run k without regard to an immediately preceding or succeeding string of code words. To put it in detail, if the 2-bit data string to be converted is (11), a code resulting from the conversion can be "000" or "101" in dependence on the immediately preceding string of code words. To be more specific; if the single channel bit of the immediately preceding string of code words is "1", the 2-bit data string (11) is converted into the code "000" in order to keep the minimum run d. If the single channel bit of the immediately preceding string of code words is '0', on the other hand, the 2-bit data string (11) is converted into the code "101" in order to keep the maximum run k.

The basic codes shown in the conversion table of Table 2 have a variable length structure. The number of basic codes with a constraint length i of 1 is 3, a value which is smaller than a required number of 4 (=2^m=2^2) These 3 basic codes are "*0*", "001" and "010". As a result, in an operation to convert a data string, there is encountered a data string which can not be converted with only a constraint length i of 1. For this reason, it is necessary to refer to basic codes with a constraint length i of up to 3 in the Table 2 in an operation to convert all data strings. That is, basic codes with a constraint length i of up to 3 is included in the Table 2 so as to allow Table 2 to serve as a sufficient conversion table.

In addition, the conversion table of Table 2 also includes substitution codes for limiting consecutive appearances of the minimum run d. If the data string is (110111) and a string of code words following a code resulting from the conversion of the data string is "010", the data string is converted into a code word of "010 000 000". If the string of codewords following a code resulting from the conversion of the data string is other than "010", on the other hand, the data string (110111) is converted in 2-bit units. To put in detail, the 2-bit trains (11), (01) and (11) in the data string are converted into a string of code words "*0*010 and *0*". As a result, the consecutive appearances of the minimum run d in the string of code words resulting from the conversion of the data string can be restrained, limiting the number of repeated minimum runs to a maximum of 6.

Furthermore, the conversion table of Table 2 enforces a conversion rule, according to which the remainder of division of the "1" count of an element in a data string by 2 having a value of 0 or 1 shall always be equal to the remainder of division of the 1,111 count of an element in the string of code words resulting from conversion of the data string by 2. That is, if the "1" count of an element in the data string is even, the "1" count of an element in the string of code words is also even and, if the "1" count of an element in the data string is odd, on the other hand, the "1" count of an element in the string of code words is also odd. For example, a data string of (000001) is converted into a string of code words of "010 100 000". In this case, the remainder of division of the "1" count of an element in the data string by 2 is 1 which is equal to the remainder of division of the "1" count of an element in the string of code words resulting from conversion of the data string by 2. That is, the "1" counts of the data string and the string of code words are both odd. As another example, a data string of (000000) is converted into a string of code words of "010 100 100". In this case, the remainder of division of the "1" count of an element in the data string by 2 is 0 which is equal to the remainder of division of the "1' count of an element in the string of code words resulting from conversion of the data string by 2. That is, the "1" counts of the data string and the string of code words are both even.

In addition, the maximum constraint length r in the conversion table of Table 2 is 4. Codes in the table with a constraint length i of 4 are the substitution codes for implementing the value 7 of the maximum run k. Such a substitution code is referred to as a maximum run assuring code. That is, a data string of (00001000) is converted into a string of code words of "000 100 100 100" whereas a data string of (00000000) is converted into a string of code words of "01 0 1 00 100 00". It should be noted, that in this case, the value of the minimum run d is kept at 1 as well.

If the conversion table of Table 2 does not include substitution codes which have a constraint length i of 4, the maximum constraint length r for the table is 3, causing code with a maximum run k of 8 to be generated. Since the table include basic codes with a constraint length i of 4, however, code with a maximum run k of 7 can be generated.

In general, the greater the maximum run k, the more inconvenient the generation of a clock signal and, thus, the poorer the stability of the system. Thus, by reducing the value of the maximum run k from 8 to 7, the characteristic of the system can be improved commensurately with the reduction in maximum run k.

That is, if the conversion table of Table 2 is created to include basic codes only, the maximum constraint length r for such a table is 3. In this case, it is possible to generate code that has a minimum run d of 1 and a maximum run k of 8. In addition, the remainder of division of the "1" count of an element in a data string by 2 having a value of 0 or 1 shall always be equal to the remainder of division of the "1" count of an element in the string of code words resulting from conversion of the data string by 2.

If the conversion table is created to also include substitution codes for limiting consecutive appearances of the minimum run d in addition to the basic codes, the maximum constraint length r for such a table is also 3. In this case, however, it is possible to generate code that has a minimum run d of 1 and a maximum run k of 8 whereas the number of consecutive minimum runs d is limited to a upper limit value. In addition, the remainder of division of the "1" count of an element in a data string by 2 having a value of 0 or 1 shall always be equal to the remainder of division of the "1" count of an element in the string of code words resulting from conversion of the data string by 2.

If the conversion table is created to also include substitution codes for assuring a maximum run k of 7 in addition to the substitution codes for limiting consecutive appearances of the minimum run d and the basic codes, the maximum constraint length r for such a table is 4. In this case, it is possible to generate code that has a minimum run d of 1 and a maximum run k of 7 whereas the number of consecutive minimum runs d is limited to a upper limit value. In addition, the remainder of division of the "1" count of an element in a data string by 2 having a value of 0 or 1 shall always be equal to the remainder of division of the "1" count of an element in the string of code words resulting from conversion of the data string by 2.

In general, however, the greater the maximum constraint length r, the poorer the propagation characteristic of a demodulation error generated in the event of a bit shift, that is, an error which is generated because an edge bit is shifted in the forward or backward direction from its normal position by 1 bit.

Comparison of Table 1 with Table 2 shows that the maximum constraint length r of the former is 2 while that of the latter is 4. Thus, Table 2 should result in characteristics poorer than Table 1. However, results of simulation to be described later by referring to Table 7 indicate that the characteristics of Table 2 are not so poor in comparison with Table 1. For example, as shown in Table 7, the average byte error rate of Table 1 is 1.014 bytes while that of Table 2 is 1.67 bytes, a value which is not much greater than that of Table 1. The difference in average byte error rate can be considered to be attributed to the fact that the number of conversion code groups in Table 1 is smaller than that in Table 2 by a difference of 2.

By the way, for a case in which a synchronization signal is inserted into any arbitrary position in a string of code words (that is, a train of channel bits) generated as a result of conversion carried out in accordance with a conversion table of Table 2, the conversion table produces code with a variable length structure. This is because the conversion table includes a termination table prescribing termination codes for terminating code resulting from conversion at any arbitrary position. A termination code is used whenever necessary.

Assume, for example, that a synchronization signal is inserted into a particular position in the code resulting from conversion. In this case, first of all, at a point of junction between a string of code words immediately preceding the particular position and a string of code words immediately succeeding the particular position, junction bits are set while keeping the minimum run d and the maximum run k and a unique pattern representing the synchronization signal is set between the junction bits. Consider a pattern of the synchronization signal that breaks the value 7 of the maximum run k. In this case, the pattern of a synchronization signal with a minimum length is a 12-bit code word (that is, 12 channel bits) given as follows:

"#011000 000 001"

The symbol "#" at the head of the pattern of the synchronization signal is a junction bit which can be '0' or "1" to be described later. The second channel bit following the "#" bit is "0" for keeping the minimum run d. The third channel bit and the subsequent bits are set at values which form a 9T unique pattern, a code pattern not prescribed in Table 2, to give a maximum run k of 8. As shown in the above pattern, the third channel bit and the last channel bit sandwich 8 consecutive "0" bits. It should be noted that, even though the last channel bit in the pattern of the synchronization signal is set at "1", by using the conversion table of Table 2, the minimum run d can be kept.

Next, the termination table and the junction bit "#" in the bit pattern of the synchronization signal are explained. As shown in Table 2, the termination table is constructed as follows:

| 00   | 000 |     |
|------|-----|-----|
| 0000 | 010 | 100 |

The termination table is required for basic codes with a constraint length i that provides a number of pairs each comprising a data string and a string of code words smaller than the required number 4 (=$2^m=2^2$).

To put it in detail, in the case of Table 2, for the constraint length i=1, since the number of pairs each comprising a data string and a string of code words is 3, the termination table is required. For the constraint length i=2, since the number of pairs each comprising a data string and a string of code words is also 3, the termination table is required. For the constraint length i=3, the number of pairs each comprising a data string and a string of code words is 5 including a pair having a substitution code. The rest is 4 pairs each including a basic code. Since the required number 4 is met, the termination table is not needed. For the constraint length i=4, since the strings of code words are all substitution codes, it is not necessary to take a termination code into consideration. Thus, the termination table is required for the constraint length i=1 wherein a termination code is used for a data string of (00). By the same token, the termination table is required for the constraint length i=2 wherein a termination code is used for a data string of (0000). According to the termination table, the data strings (00) and (0000) are converted into strings of code words "000" and "010100" respectively. As a result, in an operation to insert a synchronization signal, it is possible to avoid a situation in which data preceding the pattern of the synchronization signal can no longer be converted. That is, the conversion system is capable of eliminating a situation in which it is no longer possible to let the code immediately preceding the synchronization signal serve as a termination.

The bit "#" of the pattern of the synchronization signal is used to distinguish a case of using the termination table from a case in which the termination table is not used. To be more specific, the first channel bit "#" at the head of the pattern of the synchronization signal is set at '1' to indicate that a termination code is used or set at '0' to indicate that no termination code is used. By doing so, it is possible to correctly determine whether or not the termination table is used, that is, whether or not the termination code is used.

As described above, the pattern of a synchronization signal with a minimum length is a 12-bit code word (that is, 12 channel bits). Since a pattern of the synchronization signal that breaks the value 7 of the maximum run k but provides a maximum run k of 8 (9T) is acceptable, any other synchronization signal pattern forming a code word of at least 12 bits can be constructed. In the case of formation of a 15-bit code word, for example, the following 2 synchronization signals can be made:

"#01 000 000 001 010"
"#01 000 000 001 001"

In the case of formation of a 21-bit code word, the following synchronization signal can be made:
"#01 000 000 001 000 000 001"

The above 21-bit synchronization signal includes 2 consecutive patterns which each provide a maximum run k of 8 (9T).

Such a synchronization signal can be detected with a higher degree of reliability. Then, in the case of formation of a 24-bit code word, the following synchronization signal can be made:
"#01 001 000 000 001 000 000 001"

The above synchronization signal, a pattern having the form of "3T-9T-9T", reduces the probability that a large run (T) appears before and/or after the two consecutive patterns each providing a maximum run k of 8 (9T) as well as increases the detection power. It is possible to select what detection power that a synchronization signal should provide in accordance with system requirements.

Table 3 is another typical conversion table provided by the present invention.

TABLE 3

17PP.RML.52

| Data | Code |
|------|------|
| i = 1 Main Table: | |
| 00 | 101 |
| 01 | 100 |
| 10 | 001 |
| 11 | 000 |
| i = 2 Substitution Table A (Limits d to 1) | |
| 0000 | 100 010 |
| 0001 | 101 010 |
| 1000 | 000 010 |
| 1001 | 001 010 |
| i = 3 Substitution Table B (Limits k to 8) | |
| 111111 | 000 010 010 |
| 111110 | 001 010 010 |
| 011110 | 101 010 010 |
| 011111 | 100 010 010 |
| i = 4 Substitution Table C (Limits RMTR to 6) | |
|  | 00010001 | 100 010 010 010 |
| chan -- 0 | 10010001 | 100 000 010 010 |
| chan -- 1 | 10010001 | 000 010 010 010 |
| r = 4 Substitution Table D (Limits k to 7) | | |
| chan 010 | 11100000 | 000 001 010 010 |
| chan 010 | 11100010 | 100 001 010 010 |
| chan 010 | 11100001 | 001 010 010 010 |
| chan 010 | 11100011 | 101 010 010 010 |
| Sync | | | data: x1 ------ 0x
ch.: xx0 100 000 000 10x (12 channel bits)
data: x1 --------- 0x
ch.: xx0 100 000 000 100 000 000 10x (24 channel bits)
Termination:

add data bits '01' or '11' at begin,
and '00' or '01' at the end

The conversion table of Table 3 has a structure wherein, for the minimum run d=1, the maximum run k=7 and the constraint length i=1, 4 (=$2^m=2^2$) basic codes are provided. That is, for the constraint length i=1, the 4 basic codes are put in a main table. For the constraint length i=2 or greater, tables of substitution codes are provided for limiting parameters such as the minimum run d and the maximum run k. To be more specific, Table A for the constraint length i=2 prescribes substitute codes for limiting the minimum run d to 1. Table B for the constraint length i=3 prescribes substitute codes for limiting the maximum run k to an upper limit of 8. Table C for the constraint length i=4 prescribes substitute codes for limiting consecutive appearances of the minimum run d having the value 1. Table D for the constraint length i=4 prescribes substitute codes for limiting the maximum run k to an upper limit of 7. Thus, in the conversion table of Table 3, the maximum constraint limit r=4.

As described above, the conversion table of Table 3 includes substitution codes for limiting consecutive appearances of the minimum run d. For example, a data string of (0001001) is converted into a string of code words of "100 010 010 010". As for a data string of (10010001), an immediately preceding code word is referenced to determine whether the immediately preceding channel bit is "0" or "1". If the immediately preceding channel bit is "O11, the data string is converted into a string of code words of "100 000 010 010". If the immediately preceding channel bit is '1", on the other hand, the data string is converted into a string of code words of "000 010010 010". As a result, the string of code words resulting from the data conversion has a number of consecutively repeated minimum runs limited to a maximum of 6.

In addition, the conversion table of Table 3 enforces a conversion rule, according to which the remainder of division of the "1" count of an element in a data string by 2 having a value of 0 or 1 shall always be equal to the remainder of division of the "1" count of an element in the string of code words resulting from conversion of the data string by 2. That is, if the "1" count of an element in the data string is even, the "1" count of an element in the string of code words is also even and, if the "1" count of an element in the data string is odd, on the other hand, the "1" count of an element in the string of code words is also odd. For example, a data string of (1000) is converted into a string of code words of "000 010". In this case, the remainder of division of the "1" count of an element in the data string by 2 is 1 which is equal to the remainder of division of the "1" count of an element in the string of code words resulting from conversion of the data string by 2. That is, the "1" counts of the data string and the string of code words are both odd. As another example, a data string of (111111) is converted into a string of code words of "000 010 010". In this case, the remainder of division of the "1" count of an element in the data string by 2 is 0 which is equal to the remainder of division of the "1" count of an element in the string of code words resulting from conversion of the data string by 2. That is, the "1" counts of the data string and the string of code words are both even.

In addition, codes in the conversion table of Table 3 with a constraint length i of 4 equal to the maximum constraint length r are the substitution codes for implementing the value 7 of the maximum run k. In the case of conversion using such a substitution code, an immediately preceding string of code words is referenced. To be more specific, if the immediately preceding string of code words is "010", conversion is implemented. If the data string is (11100000) and the immediately preceding string of code words is "010", for example, conversion is implemented to result in a string of code words of "000 001 010 010". As another example, if the data string is (11100010) and the immediately preceding string of code words is "010", the data string is converted into a string of code words of "100 001 010 010".

The conversion table of Table 3 given above can not be built from basic codes only in order to implement RLL encoding. RLL code with an assured minimum run d and an assured maximum run k can be produced by using basic codes in the main table as well as substitution codes in Table A for a constraint length i of 2 and Table B for a constraint length i of 3. In this case, the maximum constraint length r is 3 and it is possible to generate code that has a minimum run d of 1 and a maximum run k of 8. In addition, the remainder of division of the "1" count of an element in a data string by 2 having a value of 0 or 1 shall always be equal to the remainder of division of the "1" count of an element in the string of code words resulting from conversion of the data string by 2.

If Table C prescribing substitution codes for limiting consecutive appearances of the minimum run d is included in the configuration of the conversion table of Table 3 in addition to the main table and Tables A and B, the maximum constraint length r is 4 and it is possible to generate code that has a minimum run d of 1, a maximum run k of 8 and a limited number of consecutive appearances of minimum runs d. In addition, the remainder of division of the "1" count of an element in a data string by 2 having a value of 0 or 1 shall always be equal to the remainder of division of the "1" count of an element in the string of code words resulting from conversion of the data string by 2. It should be noted, that in this case, it is not always necessary to refer to the immediately preceding string of code words as is the case of using Table C of Table 3.

If Table D prescribing substitution codes for assuring a maximum run k of 7 is included in the configuration of Table 3 in addition to the main table and Tables A and B and Table C prescribing substitution codes for limiting consecutive appearances of the minimum run d, the maximum constraint length r is 4 and it is possible to generate code that has a minimum run d of 1a maximum run k of 7 and limited number of consecutive appearances of minimum runs d In addition, the remainder of division of the "11" count of an element in a data string by 2 having a value of 0 or 1 shall always be equal to the remainder of division of the "1" count of an element in the string of code words resulting from conversion of the data string by 2.

The termination table of Table 2 is not required in processing to insert a synchronization signal into a particular position in a string of code words (or a train of channel bits) resulting from conversion using the conversion table of Table 3. This is because, according to the conversion table of Table 3, code can be terminated at a constraint length i of 1.

In order to make insertion of a pattern of a synchronization signal result in as efficient code as possible, the pattern is determined as follows. The 3-bit code word immediately preceding a unique pattern (or a code word string) serving as a synchronization signal and the 3-bit code word immediately succeeding the unique pattern are code words resulting from conversion according to Table 3. The 3 bits of the code words immediately preceding and immediately succeeding the unique pattern each have a format in which data bits and junction bits are mixed as follows.

First of all, the 3 bits of the immediately preceding code word are determined as follows. An m-bit unit of a data word prior to conversion where m=2 is examined. The first bit of the 2-bit unit at the head of the data word prior to conversion is an information bit while the second bit has a value of '1' f or indicating a synchronization signal. The 2-bit unit at the head of the data word is converted into a code word (channel bits) in accordance with Table 3. To put it concretely, the m bits (2 bits) of the data word (x1) are converted into n bits (3 bits) of a code word "xx0".

Then, the 3 bits of the immediately succeeding code word are determined as follows. By the same token, an m-bit unit of a data word prior to conversion where m=2 is examined. In this case, however, the first bit of the 2-bit unit at the head of the data word prior to conversion has a value of '0' for indicating a synchronization signal while the second bit is an information bit. The 2-bit unit at the head of the data word is converted into a code word (channel bits) in accordance with Table 3. To put it concretely, the m bits (2 bits) of the data word (0x) are converted into n bits (3 bits) of a code word "10x'.

When a unique pattern of the synchronization signal is set as a pattern breaking the value 7 of the maximum run k, a synchronization signal pattern that can be implemented with a shortest possible length includes the unique pattern code word of at least 12 bits (12 channel bits) given as follows:
"xx0 100 000 000 10x"

where the value of "x" is dependent on the conversion table. The above 15-bit code word includes 3 "x" bits. 2 "x" bits are at the head of the code word while 1 "x" bit is at the tail thereof. The 3 "x" bits represent the 2-bit unit of a data word prior to conversion. The remaining 12 channel bits of the code word are a redundant portion actually representing the pattern of the synchronization signal. The third channel bit of the code word is set at "0" in order to keep the minimum run d. As for the rest starting with the fourth channel bit, 9T is set as a synchronization signal pattern to provide a maximum run k of 8. To put it in detail, 8 "0"s are arranged consecutively between "1" and "1".

As described above, the unique pattern of a synchronization signal with a minimum length is a 12-bit code word (that is, 12 channel bits). Since a pattern of the synchronization signal that breaks the value 7 of the maximum run k but provides a maximum run k of 8 (9T) is acceptable, any other synchronization signal pattern forming a unique pattern code word of at least 12 bits can be constructed. In the case of formation of a 15-bit unique pattern code word, for example, the following synchronization signal can be made:
"xx0 100 000 000 100 10x"

In the case of formation of a 21-bit code word, the following synchronization signal can be made:
"Xxxo 100 000 000 100 000 000 1ox"

The above 21-bit synchronization signal comprises 2 consecutive patterns which each provide a maximum run k of 8 (9T). According to a synchronization signal, the detection power can be increased. It is possible to select what detection power that a synchronization signal should provide in accordance with system requirements.

Much like the conventional method, after a data string is converted by using a conversion table like the one shown as Table 2 or 3, DSV control can be executed by adding DSV control bits at predetermined intervals to a train of channel bits resulting from the conversion. By making use of the relation between the data string and the string of code words resulting from conversion based on Table 2 and 3, however, the DSV control can be executed with an even higher degree of efficiency.

To put it in detail, the conversion rule is followed so that the remainder of division of the "1" count of an element in a data string by 2 having a value of 0 or 1 shall always be equal to the remainder of division of the "1" count of an element in the string of code words resulting from conversion of the data string by 2. Thus insertion of DSV control bits having a value of "1" to indicate inversion and a value of "0" to indicate non-inversion into a train of channel bits is equivalent to insertion of DSV control bits having a value of "1" to indicate inversion and a value of "0" to indicate non-inversion into a train of data bits.

Consider, for example, a case in which 3 bits (001) of data are converted in accordance with Table 2. Let a DSV control bit x following the 3 bits be sandwiched in the data. In this case, the data including the DSV control bit becomes (001-x) where x is the 1-bit control bit having the value '0' or '1'. For x=0, the data including the DSV control bit is converted in accordance with Table 2 as follows:

| Data String | Code Word String |
| --- | --- |
| 0010 | 010 000 |

For x=1, on the other hand, the data including the DSV control bit is converted in accordance with Table 2 as follows:

| Data String | Code Word String |
| --- | --- |
| 0011 | 010 100 |

By applying level encoding through NRZI modulation to the string of code words resulting from the conversion using Table 2, the following level encoded code string are obtained:

| Data String | Code Word String | Encoded Code String |
| --- | --- | --- |
| 0010 | 010 000 | 011111 |
| 0011 | 010 100 | 011000 |

As shown in the above table, the last 3 bits of the first encoded code string are inverted bits of the last 3 bits of the second encoded code string. The results above imply that, by selecting (1) or (0) as a value of the DSV control bit, DSV control can be executed within a data string.

Next, consider redundancy introduced by the DSV control. Execution of the DSV control by insertion of 1 DSV control bit into a data string corresponds to execution of the DSV control by insertion of 1.5 DSV control bits into a train of channel bits where the value 1.5 is the reciprocal of the conversion rate m/n=⅔ of Tables 2 and 3. In order to execute DSV control for an RLL (1-7) table like the one shown in Table 1, it is necessary to apply the control in a train of channel bits. In this case, at least 2 channel bits are required to keep the minimum run d, making the relative redundancy high in comparison with the DSV control applied to a data string for Tables 2 and 3. In other words, in the present system, by executing DSV control in a data string, the efficiency of the DSV control can be improved.

Next, an embodiment implementing a modulation apparatus provided by the present invention is explained by referring to FIG. 1. In this embodiment, a data string is converted into a variable length code (d, k; m, n; r)=(1, 7; 2, 3; 4) by using Table 2.

As shown in FIG. 1, the modulation apparatus 1 comprises a DSV control bit determining/inserting unit 11 for determining whether the value of a DSV control bit is 'I1 or 'O' and f or inserting DSV control bits at any arbitrary intervals into a data string supplied thereto, a modulation unit 12 for modulating a data string with DSV bits inserted therein and an NRZI encoding unit 13 for converting the output of the modulation unit 12 into a recording wave train. In addition, the modulation apparatus 1 also has a timing control unit 14 for generating timing signals and supplying the signals to a variety of components.

FIG. 2 is an explanatory diagram used for describing processing carried out by the DSV control bit determining/inserting unit 11. As shown in the figure, values of DSV control bits are determined and DSV control bits are inserted into a data string at any arbitrary intervals. In order to insert a DSV control bit into a location between pieces of data DATA1 and DATA2 of an incoming data string, f or example, the DSV control bit determining/inserting unit 11 computes a cumulative DSV for data up to DATA1. The total DSV is computed by executing the steps of:

converting DATA1 into a train of channel bits;

carrying out NRZI modulation on the train of bits;

assigning the value +1 to a H (high) level (1) and the value −1 to an L (low) level (0) of the result of the NRZI modulation; and adding up the values assigned to the levels of the result of the NRZI modulation.

By the same token, the DSV control bit determining/inserting unit 11 computes a total DSV for segment DATA2 following DATA1. Let x1 be a DSV control bit to be inserted into a location between pieces of data DATA1 and DATA2. The DSV control bit determining/inserting unit 11 determines the value of the DSV control bit x1 so that the absolute value of the sum of the DSVs for DATA1, x1 and DATA2 approaches zero.

If the DSV control bit x1 is set at (1), the level codes of segment DATA2 following DATA1 are inverted. If the DSV control bit x1 is set at (Q), on the other hand, the level codes of segment DATA2 following DATA1 are not inverted. This is because, in each element of the conversion tables of Tables 2 and 3, the remainder of division of the "1" count of an element in a data string by 2 having a value of 0 or 1 shall always be equal to the remainder of division of the "1" count of an element in the string of code words resulting from conversion of the data string by 2. Thus, insertion of a (1) bit into the data string must be accompanied by insertion of "1" into the string of code words resulting from conversion of the data string in which case inversion is implied.

After the value of the DSV control bit x1 shown in FIG. 2 has been determined as described above, a DSV control bit x2 is inserted between DATA2 and DATA3, providing an a predetermined data interval between x1 and x2 to implement DSV control in the same way. In this case, the cumulative DSV is the sum of the cumulative DSV for data up to DATA1, the DSV value for x1 and the DSV data for segment DATA2.

As described above, DSV control bits are inserted into a data string in advance before the data string is modulated by the modulation unit 12 to generate a train of channel bits.

FIG. 3 is a block diagram showing a typical configuration of the modulation unit 12. As shown in the figure, a shift register 31 shifts data stored therein by 2 bits at one time, supplying its output to a constraint length judging unit 32, a minimum run consecutive appearance limiting code detecting unit 33, a run length limit assurance code detecting unit 34 and all conversion units 35-1 to 35-4. The shift register 31 supplies as many bits as required for processing to each of the components 32 to 35.

The constraint length judging unit 32 determines the constraint length i of data and supplies the length i to a multiplexer 36. When the minimum run consecutive appearance limiting code detecting unit 33 detects a special data word subject to limitation of consecutive appearances of the minimum run d, the minimum run consecutive appearance limiting code detecting unit 33 supplies a detection signal thereof (i=3) indicating the constraint length i to the constraint length judging unit 32. In the case of Table 2, the special data word is (110111). By the same token, when the run length limit assurance code detecting unit 34 detects a special data word requiring assurance of the maximum run k, the run length limit assurance code detecting unit 34 supplies a detection signal thereof (i=4) indicating the constraint length i to the constraint length judging unit 32. In the case of Table 2, the special data word is (00001000) or (00000000).

When a special data word is detected by the minimum run consecutive appearance limiting code detecting unit 33 or the run length limit assurance code detecting unit 34, the constraint length judging unit 32 passes on the constraint length i of the special data word to the multiplexer 36. At that time, the constraint length judging unit 32 may also determine another value for the constraint length by itself. In this case, however, the constraint length judging unit 32 lets the constraint length supplied by the minimum run consecutive appearance limiting code detecting unit 33 or the run length limit assurance code detecting unit 34 take precedence of that determined by itself. In other words, the greater constraint length is selected.

The conversion units 35-1 to 35-4 each form a judgment as to whether or not a basic code for data supplied thereto is cataloged in a conversion table embedded therein. If the basic code is found cataloged, the data is converted into a code word represented by the basic code and the code word resulting from the conversion is supplied to the multiplexer 36. If the basic code for the data is not cataloged in the conversion table, on the other hand, the conversion units 35-1 to 35-4 discard the data.

It should be noted that, since the modulation apparatus 12 is designed for the conversion table of Table 2, each of the conversion units 35-$i$ is designed to work for conversion of data with a constraint length i up to 4. That is, each of the conversion units 35-$i$ is designed to work for conversion of data up to a maximum constraint length r of 4.

The multiplexer 36 selects a code resulting from conversion carried out by one of the conversion units 35-$i$ corresponding to a constraint length i supplied by the constraint length judging unit 32. The selected code is then output by way of a buffer 37 as serial data.

The operation timing of each component is controlled into synchronization with timing signals generated by the timing control unit 14.

Next, the operation of the embodiment is described.

First of all, the shift register 31 supplies as many bits of data as required in processing such as formation of a judgment in 2-bit units to the constraint length judging unit 32, the minimum run consecutive appearance limiting code detecting unit 33, the run length limit assurance code detecting unit 34 and all the conversion units 35-1 to 35-4.

Provided with an embedded conversion table like the one of Table 2, the constraint length judging unit 32 determines the value of the constraint length i by referring to the conversion table and supplies the value to the multiplexer 36.

In the minimum run consecutive appearance limiting code detecting unit 33, a data word to be replaced by the substitution code for limiting the consecutive appearances of the minimum run d of Table 2 provided that the following code word is "010" is embedded. In the case of Table 2, the data word is (110111). when the data requiring limitation of consecutive appearances of the minimum run d is detected as a result of reference to this part of the conversion table, the minimum run consecutive appearance limiting code detecting unit 33 outputs a detection signal indicating that the constraint length i=3 to the constraint length judging unit 32.

In the run length limit assurance code detecting unit 34, on the other hand, data words to be replaced by the substitution codes for assuring the run length limit of Table 2 are embedded. In the case of Table 2, the data words are (00001000) and (00000000). When the data requiring assurance of the run length limit is detected as a result of reference to this part of the conversion table, the run length limit assurance code detecting unit 34 outputs a detection signal indicating that the constraint length i=4 to the constraint length judging unit 32.

When receiving a detection signal indicating that the constraint length i=3 in the case of Table 2 from the minimum run consecutive appearance limiting code detecting unit 33, the constraint length judging unit 32 passes on the value i=3 to the multiplexer 36, even if at that time the constraint length judging unit 32 determines the value of the constraint length i by itself instead of supplying the value determined by itself to the multiplexer 36. By the same token, when receiving a detection signal indicating that the constraint length i=4 in the case of Table 2 from the run length limit assurance code detecting unit 34, the constraint length judging unit 32 passes on the value i=4 to the multiplexer 36, even if at that time the constraint length judging unit 32 determines the value of the constraint length i by itself instead of supplying the value determined by itself to the multiplexer 36.

This means that, the constraint length judging unit 32 passes on the value of the constraint length i received from the minimum run consecutive appearance limiting code detecting unit 33 or the run length limit assurance code detecting unit 34 to the multiplexer 36 instead of supplying the value determined by itself if the value of the constraint length i determined by the minimum run consecutive appearance limiting code detecting unit 33 or the run length limit assurance code detecting unit 34 is found different from the value determined by itself. In other words, the greater constraint length is selected to be transmitted to the multiplexer 36.

FIG. 4 is a diagram exemplifying processing carried out by the constraint length judging unit 32, the minimum run consecutive appearance limiting code detecting unit 33 and the run length limit assurance code detecting unit 34 by showing an example in concrete terms.

As described above, in the run length limit assurance code detecting unit 34, the data words (00001000) and (00000000) of Table 2 are embedded as part of a function thereof to determine the value of the constraint length i. When 8-bit data matching the data word (00001000) or (00000000) is supplied to the run length limit assurance code detecting unit 34, the run length limit assurance code detecting unit 34 outputs a detection signal indicating that the constraint length i=4 to the constraint length judging unit 32.

In the minimum run consecutive appearance limiting code detecting unit 33, on the other hand, the data word (110111) of Table 2 are embedded as a function thereof to determine the value of the constraint length i. When 6-bit data matching the data word (110111) is supplied to the minimum run consecutive appearance limiting code detecting unit 33 and the 3-bit code word resulting from conversion following the data word is "010", the minimum run consecutive appearance limiting code detecting unit 33 outputs a detection signal indicating that the constraint length i=3 to the constraint length judging unit 32. It should be noted that the 3-bit code word "010" is a result of conversion of a data string having a value of (01), (001) or (00000) prior to the conversion. In other words, the function includes a data string (110111)+(01/001/00000). When 6-bit data matching the data word (110111) is detected, the data of up to 5 bits following the 6-bit data is compared with the data word (01) or (001) or (00000) to determine if they match each other. If the incoming data is (11011101), (11011001) or (11011100000), the minimum run consecutive appearance limiting code detecting unit 33 outputs a detection signal indicating that the constraint length i=3 to the constraint length judging unit 32.

In the constraint length judging unit 32, data strings of the conversion table of Table 2 are embedded. If 6-bit data matching the data word (000011), (000010), (000001) or (000000) is supplied to the constraint length judging unit 32, the constraint length judging unit 32 determines that the value of the constraint length i is 3. It 4-bit data matching the data word (0011), (0010) or (0001) is supplied to the constraint length judging unit 32, the constraint length judging unit 32 determines that the value of the constraint length i is 2. If 2-bit data matching the data word (11), (10) or (01) is supplied to the constraint length judging unit 32, the constraint length judging unit 32 determines that the value of the constraint length i is 1.

Assume that 6-bit data (000010) is supplied. In this case the constraint length judging unit 32 determines that the value of the constraint length i is 3. Also assume that 2 bits (00) follow the 6-bit data. As a result, 8-bit data matching the data word (00001000) is supplied to the run length limit assurance code detecting unit 34, causing the run length limit assurance code detecting unit 34 to output a detection signal indicating that the constraint length i=4 to the constraint length judging unit 32. In this case, the constraint length judging unit 32 lets the detection signal conveying the value 4 from the run length limit assurance code detecting unit 34 take precedence over the value 3 determined by itself, judging the constraint length i to have a value of 4.

As described above, the constraint length of data comprising a train of (1)s and (0)s can be determined in accordance with the conversion table of Table 2 by referring to a supplied data word of up to 8 bits corresponding to a maximum constraint length and, if necessary, a 3-bit code word. As an alternative, the constraint length of data comprising a train of (1)s and '(0)s can be determined by referring to only a supplied data word of up to 11 bits.

The constraint length judging unit 32 supplies the value of the constraint length i determined in this way to the multiplexer 36.

It should be noted that the constraint length judging unit 32 can also determine the value of the constraint length i in an ascending order of the values of i starting with the smallest one, that is, in the order of i=1, i=2, i=3 and i=4 as opposed to the one shown in FIG. 4.

The conversion units 35-1 to 35-4 each have a conversion table corresponding to a value of the constraint length assigned thereto. To be more specific, the conversion units 35-1 to 35-4 have conversion tables for i=1, i=2, i=3 and i=4 respectively. If a conversion rule for data supplied to any one of the conversion units 25-1 to 35-4 is cataloged in a table of the conversion units, the 2×i bits of the supplied data are converted into a 3×i bits of code in accordance with the cataloged conversion rule. The resulting code is then supplied to the multiplexer 36.

The multiplexer 36 selects a code resulting from conversion carried out by one of the conversion units 35-i corresponding to a constraint length i supplied by the constraint length judging unit 32. The selected code is then output by way of a buffer 37 as serial data.

As shown in Table 2, for the constraint length i=3, the conversion table does not include a substitution code for a data string (110111) which requires limitation on the consecutive repetitive appearances of the minimum run d. Assume that the following data string is supplied:

(1101110111011101)

In this case, the conversion processing is carried out in the following order of data words: (11), (01), (11), (01) and so on. As a result of the conversion, the following string of code words (a train of channel bits) is generated:

"101 010 101 010 101 010 101 010"

Then, typically NRZI modulation is applied to the generated string of code words in order to carry out level encoding. Since inversion of logic takes place with '1' timing in the signal, the above string of code words is converted into the following string of code words:

'110 011 001 100 110 011' where minimum inversion intervals of 2T continue throughout the string. When recorded or played back at a high line density, such a code string becomes a pattern which easily causes an error in the recording or playback operation.

Assume that the conversion table of Table 2 also prescribes a substitution code for a data string (110111) which requires limitation on the repetitive consecutive appearances of the minimum d. Now, let the following data string be supplied:

(1101110111011101)

In this case, the first data word (11011101) in the data string comprises a data word (110111) followed by a data word (01) which will be converted into a string of code words "010". Thus, the first data word is converted into the following string of code words:

"001 000 000 010".

Likewise, the second data word (11011101) in the data string also comprises the data word (110111) followed by the data word (01) which will be converted into the string of code words "010". Thus, the first data word is converted into the following string of code words:

"001 000 000 010".

As a result, the data string is converted into the following string of code words:

"001 000 000 010 001 000000010 . . . "

wherein the repetitive consecutive appearances of the minimum run d are prevented. That is, a pattern which easily causes an error in the recording or playback operation at a high line density is eliminated. It should be noted that, in the conversion of the data string into the string of code words described above, the minimum run d and the maximum run k are kept at their respective values.

As described above, the conversion carried out by the modulation apparatus 1 is based on the conversion table of Table 2. It should be noted that the conversion can also be carried out by using the conversion table of Table 3. In this case, the minimum run consecutive appearance limiting code detecting unit 33 employed in the modulation unit 12 shown in FIG. 3 is provided with Table C for the constraint length i=4 of Table 3. on the other hand, the run length limit assurance code detecting unit 34 is provided with Table A for the constraint length i=2, Table B for the constraint length i=3 and Table D for the constraint length i 4 of Table 3.

By the way, in Tables 2 and 3, the composition of each pair of a data string and a string of code words within a group of the same constraint length may be changed. In the case of the group of the constraint length i=1 of Table 2, for example, the composition of each pair is originally shown below:

| | Data | Code |
|---|---|---|
| i = 1 | 11 | *0* |
| | 10 | 001 |
| | 01 | 010 |

The pair composition can be changed as follows:

| | Data | CO |
|---|---|---|
| i = 1 | 11 | *0* |
| | 10 | 010 |
| | 01 | 001 |

Even with a changed pair composition, the remainder of division of the "1" count of an element in a data string by 2 having a value of 0 or 1 shall al ways be equal to the remainder of division of the "1" count of an element in the string of code words resulting from conversion of the data string by 2.

Next, an embodiment implementing a demodulation apparatus provided by the present invention is explained by referring to FIG. 5. In the present embodiment, a variable length code (d, k; m, n; r)=(1, 7; 2, 3; 4) is demodulated back into a data string using Table 2.

As shown in FIG. 5, the demodulation apparatus 100 comprises a demodulation unit 111 for demodulating a signal received from a transmission line or a signal played back from a recording medium by using a demodulation table or an inverse conversion table and a DSV control bit removing unit 112 for taking out DSV control bits inserted into a data string resulting from the demodulation at arbitrary intervals from the data string in order to restore the original data string. A buffer 113 is used for temporarily storing serial data generated by the DSV control bit removing unit 112. The data stored in the buffer 113 is read out back later at a predetermined transfer rate to produce an output signal. A timing control unit 114, generates timing signals and supplies the signals to a variety of components in order to control timing of their operations.

FIG. 6 is a block diagram showing the configuration of the demodulation unit 111. As shown in the figure, the demodulation unit 111 has a comparator 121 for converting a signal received from a transmission line or a signal played back from a recording medium into binary data. If the signal supplied to the comparator 121 is a signal completing NRZI modulation (that is, level encoding), the signal undergoes an inverse NRZI encoding process (that is, an edge encoding process) A constraint length judging unit 122 determines the constraint length i of a digital signal received from the comparator 121. When a minimum run consecutive appearance limiting code detecting unit 123 detects a special code for limiting consecutive appearances of the minimum run d in the digital signal generated by the comparator 121, the minimum run consecutive appearance limiting code detecting unit 123 supplies a detection signal thereof (i=3) indicating the constraint length i to the constraint length judging unit 122. In the case of Table 2, the special code is "001 000

000". By the same token, when a run length limit assurance code detecting unit 124 detects a special code for assuring the maximum run k, the run length limit assurance code detecting unit 124 supplies a detection signal thereof (i=4) indicating the constraint length i to the constraint length judging unit 122. In the case of Table 2, the special code is "000 100 100 100" or "010 100 100 100".

Inverse conversion units 125-1 to 125-4 each have a table used for inversely converting n×i-bit variable length code back into m×i-bit data. In the case of Table 2, the inverse conversion units 125-1 to 125-4 have the inverse conversion tables for the constraint length i=1 to 4 respectively which are in essence the same as the conversion tables embedded in the conversion units 35-1 to 35-4 described earlier. A multiplexer 126 selects one of the outputs generated by the inverse conversion units 125-1 to 125-4 in dependence on a judgment result received from the constraint length judging unit 122.

Next, the operation of the demodulation unit 111 shown in FIG. 6 is explained. A signal received from a transmission line or a signal played back from a recording medium is supplied to the comparator 121 to undergo comparison. A signal output by the comparator 121 is a digital signal of inverse NRZI code, that is, code with "1" indicating an edge. The digital signal is then supplied to the constraint length judging unit 122 for determining the constraint length i of the signal by using the conversion table (strictly speaking, the inverse conversion table) of Table 2. A judgment result, that is, a value of the constraint length i, produced by the constraint length judging unit 122 is supplied to the multiplexer 126.

In addition, the digital signal output by the comparator 121 is supplied also to the minimum run consecutive appearance limiting code detecting unit 123. The minimum run consecutive appearance limiting code detecting unit 123 has an embedded inverse conversion portion including a substitution code of the inversion table of Table 2 for limiting consecutive appearances of the minimum run d. In the case of Table 2, the substitution code is the code word "001 000 000". When a code "001 000 000 not 100" cataloged in the inverse conversion table for limiting consecutive appearances of the minimum run d is detected from the digital data, the minimum run consecutive appearance limiting code detecting unit 123 outputs the constraint length i=3 to the constraint length judging unit 122.

Furthermore, the digital signal output by the comparator 121 is supplied also to the run length limit assurance code detecting unit 124. The run length limit assurance code detecting unit 124 has an embedded inverse conversion portion including substitution codes of the inversion table of Table 2 for keeping the maximum run k. In the case of Table 2. the substitution codes are the code words "000 100 100 100" and "010 100 100 100". When the code word "000 100 100 100" or "010 100 100 100" cataloged in the inverse conversion table for keeping the maximum run k is detected from the digital data, the run length limit assurance code detecting unit 124 outputs the constraint length i=4 to the constraint length judging unit 122.

FIG. 7 is a diagram showing a summary of the processing to determine the constraint length i of a modulated code supplied to the demodulation apparatus 100. As shown in the figure, the run length limit assurance code detecting unit 124 has an embedded inverse conversion portion including the code words "000 100 100 100" and "010 100 100 100" of the inversion table of Table 2. When a 12-bit string of code words supplied to the run length limit assurance code detecting unit 124 matches either of the code words in the inverse conversion portion, the run length limit assurance code detecting unit 124 outputs the constraint length i=4 to the constraint length judging unit 122.

By the same token, the minimum run consecutive appearance limiting code detecting unit 123 has an embedded inverse conversion portion including the code word "001 000 000" of the inversion table of Table 2. When a 12-bit string of code words supplied to the minimum run consecutive appearance limiting code detecting unit 123 matches "001 000 000 not 100", the minimum run consecutive appearance limiting code detecting unit 123 outputs the constraint length i=3 to the constraint length judging unit 122. It should be noted that the detected 12 bits of the string of code words are actually "001 000 000 010" even though it has nothing to do with the determination of the constraint length i in particular.

The constraint length judging unit 122 has an embedded inverse conversion table of Table 2. If a 9-bit string of code words supplied to the constraint length judging unit 122 is "000 100 100" or "010 100 100" or if a 12-bit string of code words supplied thereto is "000 100 000 not 100" or "010 100000 not 100", the constraint length judging unit 122 determines that the constraint length i is 3. If a 6-bit string of code words supplied to the constraint length judging unit 122 is "010 100" or "000 100', or if a 9-bit string of code words supplied thereto is "010 000 not 100", on the other hand, the constraint length judging unit 122 determines that the constraint length i is 2. otherwise, if a 3-bit string of code words supplied to the constraint length judging unit 122 is "000", "101", "001" or "010" the constraint length judging unit 122 determines that the constraint length i is 1.

It should be noted that the constraint length judging unit 122, the minimum run consecutive appearance limiting code detecting unit 123 and the run length limit assurance code detecting unit 124 can each also carry out the processing in an ascending order of the values of i starting with the smallest one, that is, in the order of i=1, i=2, i=3 and i=4 as opposed to the one shown in FIG. 7.

Assume that the constraint length judging unit 122 can also determine the value of the constraint length i in the order of i=2/i=3 and i=4 and a string of code words "000 100 100 100" is supplied to the constraint length judging unit 122. The constraint length judging unit 122 compares the string of code words supplied thereto with code words in the embedded conversion table in an ascending order of the values of the constraint length i starting with the smallest one to form a judgment as to whether or not the string of code words matches the code words. The string of code words "000 100 100 100" supplied to the constraint length judging unit 122 matches one of the code words for all the constraint lengths i=1, i=2, i=3 and i=4. In such a case, as a rule of determination, the largest constraint length is selected and supplied to the multiplexer 126.

The inverse conversion table of the inverse conversion unit 125-1 is implemented as a memory wherein a piece of data (11) is stored at addresses "101" and "000" whereas pieces of data (10) and (01) are stored at addresses "001" and "010" respectively. The inverse conversion tables of the inverse conversion units 125-2 and 125-4 are each implemented as a memory for storing data in the same way as the inverses conversion unit 125-1. A string of code words of 3×i bits supplied to the inverse conversion unit **125-*i* is converted back into a data string of 2×i bits which is then supplied to the multiplexer 126**.

The multiplexer 126 selects one of the data strings supplied by the inverse conversion units 125-1 to 125-4 in accordance with a result of determination of the value of the constraint length i output by the constraint length judging unit 122.

Table 4 is the inverse conversion table for Table 2.

TABLE 4

Inverse Conversion Table (1, 7; 2, 3; 4)

| Code word string | Demodulated data string |
|---|---|
| i = 1 | |
| 101 | 11 |
| 000 | 11 |
| 001 | 10 |
| 010 | 01 |
| i = 2 | |
| 010 100 | 0011 |
| 010 000 (not 100) | 0010 |
| 000 100 | 0001 |
| i = 3 | |
| 000 100 100 | 000011 |
| 000 100 000 (not 100) | 000010 |
| 010 100 100 | 000001 |
| 010 100 000 (not 100) | 000000 |
| i = 3: Prohibit Minimum Transition Run length | |
| 001 000 000 (not 100) | 110111 |
| i = 4: Limits k to 7 | |
| 000 100 100 100 | 00001000 |
| 010 100 100 100 | 00000000 |

FIG. 8 is a flowchart used as a reference in explanation of operations carried out by the DSV control bit removing unit 112. The DSV control bit removing unit 112 is provided with an internal counter. As shown in the figure, the flowchart begins with a step S1 at which the number of bits in a data string supplied by the demodulation unit 111 is counted by the internal counter. The flow of processing then goes on to a step S2 to form a judgment as to whether or not the number of bits has reached a value representing a predetermined data interval at which a DSV control bit is inserted. if the outcome of the judgment indicates that the number of bits does not correspond to an arbitrary data interval, the flow of processing proceeds to a step S3 at which the data supplied by the demodulation unit 111 is output to the buffer 113 as it is. If the outcome of the judgment indicates that the number of bits corresponds to the predetermined data interval, indicating that the current bit is a DSV control bit, on the other hand, the processing of the step S3 is skipped. That is, the current bit of the data string is discarded instead of being output to the buffer 113 in this case.

In either case, the flow of processing proceeds to a step S4 at which processing to input a next data string is carried out. The flow of processing then continues to a step S5 to form a judgment as to whether or not the processing of all data has been completed. If data which remains to be processed exists, the f low of processing returns to the step S1 to repeat the execution of the processing. If the outcome of the judgment formed at the step S5 indicates that all data has been processed, on the other hand, the processing is ended.

As a result. DSV control bits are removed from data output by the DSV control bit removing unit 112. The data is then output by way of the buffer 113.

According to the description given above, the demodulation unit 111 uses the conversion table of Table 2 or, strictly speaking, the inverse conversion table of Table 4. It should be noted that similar processing can be carried out by using the conversion of Table 3 or, strictly speaking, the inverse conversion table of Table 5 given below. In this case, the minimum run consecutive appearance limiting code detecting unit 123 employed in the modulation unit 111 shown in FIG. 6 is provided with Table C f or the constraint length i=4 of Table 3. On the other hand, the run length limit assurance code detecting unit 124 is provided with Table A for the constraint length i=2, Table B for the constraint length i=3 and Table D for the constraint length i=4 of Table 3.

TABLE 5

Inversion Conversion Table (1, 7; 2, 3; 4)

| Code Word String | Demodulated Data String |
|---|---|
| r = 1 Main Table | |
| 101 | 00 |
| 100 | 01 |
| 001 | 10 |
| 000 | 11 |
| r = 2 Substitution Table A (Limits d to 1) | |
| 100 010 | 0000 |
| 101 010 | 0001 |
| 000 010 | 1000 |
| 001 010 | 1001 |
| r = 3 Substitution Table B (Limits k to 8) | |
| 000 010 010 | 111111 |
| 001 010 010 | 111110 |
| 101 010 010 | 011110 |
| 100 010 010 | 011111 |
| r = 4 Substitution Table C (Limits RMTR to 6) | |
| 100 010 010 010 | 00010001 |
| 100 000 010 010 | 10010001 |
| 000 010 010 010 | 10010001 |
| r = 4 Substitution Table D (Limits k to 7) | |
| 000 001 010 010 | 11100000 |
| 100 001 010 010 | 11100010 |
| 001 010 010 010 | 11100001 |
| 101 010 010 010 | 11100011 |

By the way, there are cases in which it is necessary to insert a synchronization signal (Sync) into data. Next, embodiments implementing a modulation apparatus 1 and a demodulation apparatus 100 that are capable of coping with data with inserted synchronization signals are described by referring to FIGS. 9 and 10 respectively. Also in the case of these embodiments, a data string is modulated into a variable length code (d, k; m, n; r)=(1, 7; 2, 3; 4).

In another modulation apparatus of the present invention shown in FIG. 9 wherein synchronization signals are inserted at predetermined intervals, the output of a DSV control bit determining/inserting unit 11 is supplied to a synchronization signal determining unit 211. Also supplied to the synchronization signal determining unit 211 is the output of a modulation unit 12. When the synchronization signal determining unit 211 determines a synchronization signal from the signals supplied by the DSV control bit determining/inserting unit 11 and the modulation unit 12, the synchronization signal determining unit 211 outputs a synchronization signal to a synchronization signal inserting unit 212. The synchronization signal inserting unit 212 inserts the synchronization signal supplied by the synchronization signal determining unit 211 into a modulated signal supplied by the modulation unit 12 and supplies the output thereof to an NRZI encoding unit 13. The rest of the configuration is the same as the modulation apparatus 1 shown in FIG. 1.

In the case of a pattern of a 24-bit code word to serve as a synchronization signal, the synchronization signal is converted by the synchronization signal determining unit 211 in accordance with Table 2 into the following code:

"1#01 001 000 000 001 000 000 001"

where the symbol # denotes a bit that is dependent on an immediately preceding data string, including a DSV control bit if any, delimited by the insertion of the synchronization signal. To be more specific, when a termination table is used for termination in an operation to modulate the delimited data string by using the conversion table, "#"="1". When Table 2 is used for termination instead of the termination table, on the other hand, "#"="0". Thus, the modulation unit 12 outputs "#"="1" or "#"="0" to the synchronization signal determining unit 211 when the termination table is used or not used respectively. Receiving the value of "#" from the modulation unit 12, the synchronization signal determining unit 211 appends the value of "#" at the head of a synchronization signal and then outputs the synchronization signal to the synchronization signal inserting unit 212.

The synchronization signal inserting unit 212 inserts the synchronization signal supplied by the synchronization signal determining unit 211 into a modulated signal supplied by the modulation unit 12 and supplies the output thereof to the NRZI encoding unit 13. The rest of the processing is the same as the modulation apparatus 1 shown in FIG. 1.

The first data following the inserted synchronization signal is converted starting with the head thereof without considering data immediately preceding the synchronization signal. The modulation unit 12 and the synchronization signal determining unit 211 are each provided with a counter for counting the number of predetermined intervals at which synchronization signals are inserted. The contents of the counter are used for determining the position of a synchronization signal.

As described above, the embodiment shown in FIG. 9 uses the conversion table of Table 2. It should be noted that the conversion table of Table 3 can also be used. In this case, the synchronization signal determining unit 211 adopts a 12-bit code word given below as a pattern of the synchronization signal:

"xx0 100 000 000 10x"

where the symbol "x" denotes a bit that is dependent on the immediately preceding and succeeding data strings, including a DSV control bit if any, delimited by the insertion of the synchronization signal. The 3 bits at the head and the 3 bits at the tail of the synchronization signal are determined by Table 3 as follows. Let (p) be the last data string delimited by the insertion of the synchronization signal and (q) be first data string immediately following the synchronization signal. A data string (p) is converted into the 3 bits at the head of the synchronization signal while a data string (0q) is converted into the 3 bits at the tail of the synchronization signal by using Table 3. The 3 bits at the head and the 3 bits at the tail of the synchronization signal resulting from the conversion sandwich the middle bits "100 000 000" to produce the pattern. By doing so, a synchronization signal which breaks the required maximum run k but always keeps it at k=8 (9T) can be generated.

FIG. 10 is a block diagram showing a typical configuration of an embodiment implementing another demodulation apparatus 100 for demodulating code resulting from modulation carried out by the modulation apparatus 1 shown in FIG. 9. As shown in FIG. 10, in the present embodiment, an incoming signal transmitted through a predetermined transmission path is supplied to a demodulation unit 111 and a synchronization signal identifying unit 221. The synchronization signal identifying unit 221 uses the incoming signal and a signal received from the demodulation unit 111 to identify a synchronization signal, outputting the synchronization signal to a synchronization signal removing unit 222. The synchronization signal removing unit 222 removes a synchronization signal from a demodulated signal supplied by the demodulation unit 111 in accordance with the signal output by the synchronization signal identifying unit 221. The demodulated signal with its synchronization signals removed is then supplied to a DSV control bit removing unit 112. The rest of the configuration is the same as the demodulation apparatus 100 shown in FIG. 5.

The synchronization signal identifying unit 221 has an embedded counter for counting the number of code words. The contents of the counter are used for determining the position of each of synchronization signals which are inserted into the string of data words at predetermined intervals. After the position of a synchronization signal pattern has been identified, the "#" bit determined at modulation is read out. That is, the bit at the head of the synchronization signal is read out and output to the demodulation unit 111. If the head bit is "1", the demodulation unit 111 uses the termination table of Table 2 in the demodulation a code immediately preceding the synchronization signal. If the head bit is "0", on the other hand, the demodulation unit 111 uses a table of conversion codes in Table 2 in the demodulation a code immediately preceding the synchronization signal. The remaining bits of the synchronization signal are discarded since they convey no information.

The synchronization signal identifying unit 221 outputs an identification signal for identifying bits composing a synchronization signal to the synchronization signal removing unit 222. The synchronization signal removing unit 222 removes a synchronization signal from a demodulated signal supplied by the demodulation unit 111 in accordance with the identification signal output by the synchronization signal identifying unit 221. The demodulated signal with its synchronization signals removed is then supplied to a DSV control bit removing unit 112.

As described above, the demodulation apparatus 100 shown in FIG. 10 uses the conversion table of Table 2. It should be noted that Table 3 can also be used as well. In this case, for example, the synchronization signal identifying unit 221 uses the contents of the counter for determining the position of each of synchronization signals which are inserted into the string of data words at predetermined intervals. After the position of a synchronization signal pattern has been identified, the synchronization signal identifying unit 221 outputs signals specifying the 3 bit-code words at the head an the tail of the synchronization signal pattern to the demodulation unit 111 to request the demodulation unit 111 that these code words are also demodulated since they each include a data string.

The synchronization signal identifying unit 221 outputs a signal specifying bits of the unique pattern of the synchronization signal excluding the code words which include data strings to the synchronization signal removing unit 222. Thus, the synchronization signal removing unit 222 is capable of removing only the synchronization signal bits, that is, the bits of the unique pattern, specified by the signal received from the synchronization signal identifying unit 221.

FIG. 11 is a diagram showing an example of code for recording with synchronization signals and DSV control bits inserted into it. In this example, a 24-bit code word is used as a synchronization signal. DSV control is executed at intervals of 56 data bits and a synchronization signal is inserted for each 5 executions of DSV control. Thus, the number of code words, that is, the number of channel bits per each synchronization signal is:

24+(1+56+1+56+1+56+1+56+1)×1.5=453 code words (channel bits).

The relative redundancy introduced into the data words is about 7.3% as is obvious from the following calculation:

Amount of data=(56×5)1.5/453=420/453=0.927

Thus, the relative redundancy=1−0.927=0.0728=7.3%

The inventors and some other people run simulations using the conversion tables described above to produce results of modulation. Results of modulation of a data string including inserted DSV control bits with consecutive appearances of Tmin limited are described below. In the simulation, Tables 2 and 3 were used. A simulation using Table 1 for the conventional RLL (1-7) modulation was also run for comparison purposes.

In the simulations, DSV control was executed by inserting 1 DSV control bit for each 56 data bits of random data comprising 13,107,200 bits made arbitrarily and the data was then converted into a string of code words (or a train of channel bits) by using the conversion code table of Table 2 or 3. In another simulation, random data comprising 13,107,200 bits made arbitrarily was converted into a string of code words (or a train of channel bits) by using the conversion code table of Table 1 and 2 channel bits were then inserted as DSV control bits for each 112 code words or 112 channel bits of the resulting string of code words in order to execute DSV control.

The reason why, in the simulation using Table 2 or 3, 1 DSV control bit was inserted for each 56 data bits while, in the simulation using Table 1, 2 DSV control bits were inserted for each 112 code words is to make the relative redundancy caused by the DSV control bits uniform for both the simulations. If the number of bits required for DSV control in one case is different from that in another case and the relative redundancy has to be made uniform for both the cases, Table 2 or 3 that allows the DSV control to be executed with a high degree of efficiency provides a good low band characteristic in comparison with Table 1.

Numerical values of the simulation results are computed as follows:

Ren_cnt [1 to 101: occurrence counts of 1 single minimum run to 10 consecutive minimum runs.

T_size [2 to 10] Occurrence counts of the 2T run to the 10T run.

Sum: The number of bits

Total: The number of run lengths, that is, the total number of occurrence counts of the 2T run, the 3T run, etc.

Average Run: (Sum/Total)

Numerical values of run distribution: (T_size [i]*(i)/Sum) where i=2, 3, 4, . . . 10

The numerical values on rows 2T to 10T of Table 6 are the numerical values of the run distribution.

Numerical values of distribution of the consecutive minimum runs:

(Ren_cnt [i]*(i))/T_size [2T] where i=1, 2, 3, 4 . . . 10.

The numerical values on rows RMTR (1) to RMTR (9) of Table 6 are the numerical values of the distribution of the consecutive minimum runs.

Max_RMTR: The maximum number of minimum run repetitions peak DSV: Peaks of calculated DSV values on the positive and negative sides observed in a process of executing DSV control on a train of channel bits.

The calculation of the relative redundancy caused by insertion of 1 DSV bit for each 56 data bits is based on the fact that 1 DSV bit exists for every 56 data bits. Thus, the relative redundancy is computed as follows:

Relative redundancy=1/(1+56)=1.75%

The calculation of the relative redundancy caused by insertion of 2 DSV bits for each 112 code bits is based on the fact that 2 DSV bits exist for every 112 code word bits. Thus, the relative redundancy is computed as follows:

Relative redundancy=2/(2+112)=1.75%

Thus, the same redundancy is obtained for both the cases.

TABLE 6

PP17 Comparison

| Average | <Table 2><br>17PP-32 | <Table 3><br>17PP-52 | <Table 1><br>+2 bit -<br>DC (DSV control) | Without - DCC)<br>(No DSV control) |
|---|---|---|---|---|
| Run | 3.3665 | 3.4048 | 3.3016 | 3.2868 |
| Sum | 20011947 | 20011947 | 20011788 | 19660782 |
| Total | 5944349 | 5877654 | 6061150 | 5981807 |
| 2T | 0.2256 | 0.2246 | 0.2417 | 0.1419 |
| 3T | 0.2217 | 0.2069 | 0.2234 | 0.2281 |
| 4T | 0.1948 | 0.1935 | 0.1902 | 0.1915 |
| 5T | 0.1499 | 0.1491 | 0.1502 | 0.1511 |
| 6T | 0.1109 | 0.1904 | 0.1135 | 0.1141 |
| 7T | 0.0579 | 0.0814 | 0.0561 | 0.0544 |
| 8T | 0.0392 | 0.0351 | 0.0218 | 0.0188 |
| 9T | — | 0.0023 | — | — |
| 1OT | — | 0.0009 | — | — |
| RMTR (1) | 0.3837 | 0.3890 | 0.3628 | 0.3641 |
| RMTR (2) | 0.3107 | 0.3137 | 0.2884 | 0.2883 |
| RMTR (3) | 0.1738 | 0.1906 | 0.1717 | 0.1716 |
| RMTR (4) | 0.0938 | 0.0806 | 0.0909 | 0.0907 |
| RMTR (5) | 0.0299 | 0.0228 | 0.0456 | 0.0452 |
| RMTR (6) | 0.0081 | 0.0033 | 0.0219 | 0.0217 |
| RMTR (7) | — | — | 0.0100 | 0.0099 |

TABLE 6-continued

PP17 Comparison

| Average | <Table 2><br>17PP-32 | <Table 3><br>17PP-52 | <Table 1><br>+2 bit -<br>DC (DSV control) | Without - DCC)<br>(No DSV control) |
|---|---|---|---|---|
| RMTR (8) | — | — | 0.0047 | 0.0046 |
| RMTR (9) | — | — | 0.0022 | 0.0022 |
| Max_RMTR | 6 | 6 | 18 | 18 | peak DSV # −36 to 36 # −35 to 40 * −46 to 43 * −1783 to 3433
("#": 56 data bits + 1 dc bit, 1.75%) ("*": 112 cbits + 2 dc bits, 1.75%)

The results given above verify that, by using Tables 2 and 3, the RLL (1, 7) system is implemented while, at the same time, the minimum and maximum runs are kept and the number of consecutive appearances of the minimum run is limited to 6. In addition, the results of the DSVs verify that DSV control can be executed in a data string (that is, the values of the peak DSV are contained in a predetermined range) and, in this case, since the efficiency of DSV control bits is high, it is possible to obtain low band components which are more satisfactory than the conventional method of inserting DSV bits into a string of code words (a train of channel bits). The DSV results verify that, in the case of Table 1, the difference between the positive and negative peak DSVs is 89 (=46+43) while, in the case of Tables 2 and 3, the differences are 72=36+36) and 75 (=35+40) respectively which are both smaller than the value for Table 1.

It is obvious from the above description that, in comparison with the conventional RLL (1-7) system, that is, the system based on Table 1, the so-called 17PP system using Table 2 or 3 is capable of limiting the number of minimum run repetitions to 6 at the most. As a result, the improvement of the error characteristic at a high line density can be expected.

In addition, since the efficiency of the DSV control is excellent, execution of the DSV control in the 17PP system at the same 1.75% relative redundancy as the conventional RLL (1-7) system results in a smaller difference between the negative and positive peak values. As a result, since the low band components can be suppressed, stable data recording/playback operations can be carried out.

Furthermore, a simulation was also run to examine the propagation of a demodulation error caused by a bit shift in a train of channel bits generated from the same random data as the case described above. A result of the examination indicates that the worst error propagation in the 17PP system is 3 bytes. However, the result also verifies that the frequency of the actual generation of the error is all but 0, a value indicating not so much deterioration in comparison with the conventional RLL (1-7) system. Average byte error rates of 1.014 bytes for Table 1, 1.167 bytes for Table 2 and 1.174 bytes for Table 3 have been verified. It should be noted that, for the conversion tables provided by the present invention, the numerical values of the error rate results include DSV control bits but, for the conventional RLL (1-7) system, the numerical value does not include DSV control bits. That is, the measurements can not necessarily be said to have been carried out under the same conditions. The difference in measurement condition may affect the numerical values and it is thus necessary to take the effect of the difference on the values into consideration in the comparison.

TABLE 7

Shift Error Responses

| | <Table 2><br>17PP-32 | <Table 3><br>17PP-52 | <Table 1><br>+2bit-DC |
|---|---|---|---|
| Worst case | 3 bytes | 3 bytes | 2 bytes |
| (dc bits) | Included | Included | Excluded |
| Byte error (0) | 0.028 | 0.096 | 0.080 |
| Byte error (1) | 0.777 | 0.0635 | 0.826 |
| Byte error (2) | 0.195 | 0.268 | 0.094 |
| Byte error (3) | 0.000 | 0.001 | — |

Average
Byte error rate 1.167 bytes 1.174 bytes 1.014 bytes

As described above, in the present embodiment, the conversion tables with a minimum run d of 1, a maximum run k of 7 and a conversion rate m/n of ⅔ include substitution codes for limiting the number of minimum run length consecutive appearances, giving rise to the following effects:

(1) The recording and playback performance at a high line density and the tolerance against a tangential tilt are improved.
(2) It is possible to reduce the number of low level portions, to increase the
accuracy of wave processing such as the AGC and the PLL and, hence, to enhance the overall characteristic.
(3) In comparison with the conventional system, it is possible to have a design with a small path memory length of bit abi code or the like and, hence, to reduce the size of the circuit.

In addition, the remainder of division of the "1" count of an element in a data string by 2 having a value of 0 or 1 shall always be equal to the remainder of division of the 111" count of an element in the string of code words resulting from conversion of the data string by 2, providing the following additional effects:

(4) The number of redundant bits for the DSV control can be reduced.
(5) At a minimum run d of 1 and conversion parameters (m, n) of (2, 3), DSV control can be executed with a 1.5-bit code word.
(6) In addition to a low relative redundancy, the minimum and maximum runs d and k can be kept.

Furthermore, the conversion tables specially include substitution codes for keeping the run length limit, giving rise to the following additional effects:

(7) The tables are compact.
(8) The propagation of a modulation error caused by a bit shift can be put in the same state as the conventional system based on Table 1.

It should be noted that, as a program presenting medium for presenting a computer program to be executed for carrying the processing described above, a CD-ROM and a solid state memory, communication media such as a network and a satellite can be used in addition to a recording medium such as a magnetic disc.

[Effects of the Invention]

As described above, according to a modulation apparatus claimed as claim 1, a modulation method claimed as claim 23, a program presenting medium claimed as claim 24, a demodulation apparatus claimed as claim 25, a demodulation method claimed as claim 28 and a program presenting medium claimed as claim 29, conversion processing is carried out on the basis of a conversion table enforcing a conversion rule, according to which the remainder of division of a '1' count of an element in a data string by 2 having a value of 0 or 1 shall always be equal to the remainder of division of a '1' count of an element in the string of code words resulting from conversion of the data string by 2 and conversion codes of the conversion table comprising:

basic codes for d=1, k=7, m=2 and n=3;

first substitution codes for limiting the number of consecutive appearances of the minimum run d; and second substitution codes for keeping the run length limit k As a result, DSV control can be executed by using a small number of redundant bits and a string of code words can be recorded and played back with few errors at a high line density. In addition, the growth of the propagation of a demodulation error caused by a bit shift can be suppressed.

BRIEF DESCRIPTION OF THE DRAWINGS

Embodiments of the present invention have been described by referring to the following diagrams wherein.

Figure 1:
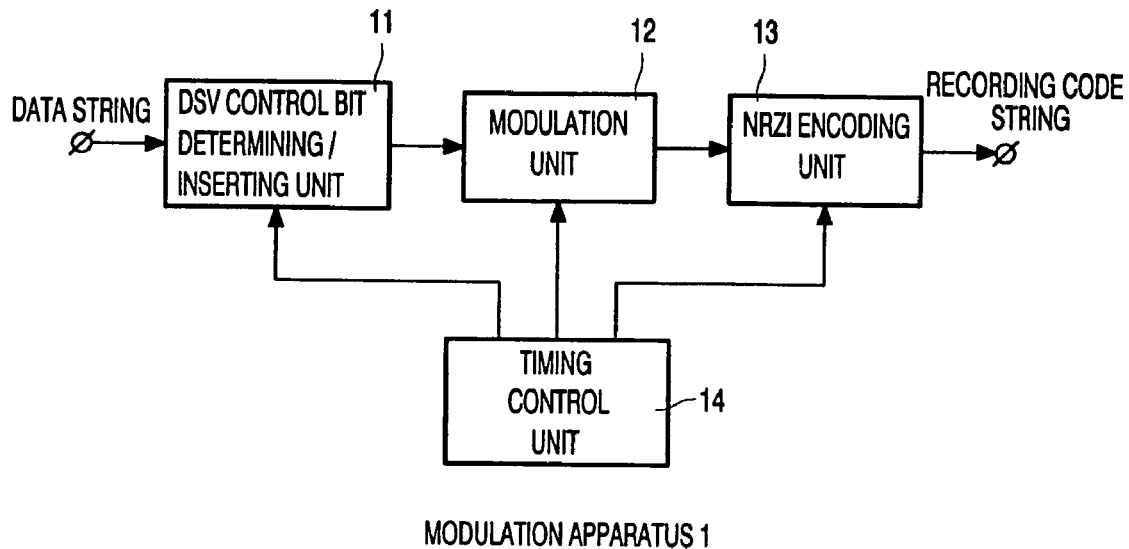
FIG. 1 is a block diagram showing a typical configuration of an embodiment implementing a modulation apparatus provided by the present invention.
Figure 2:
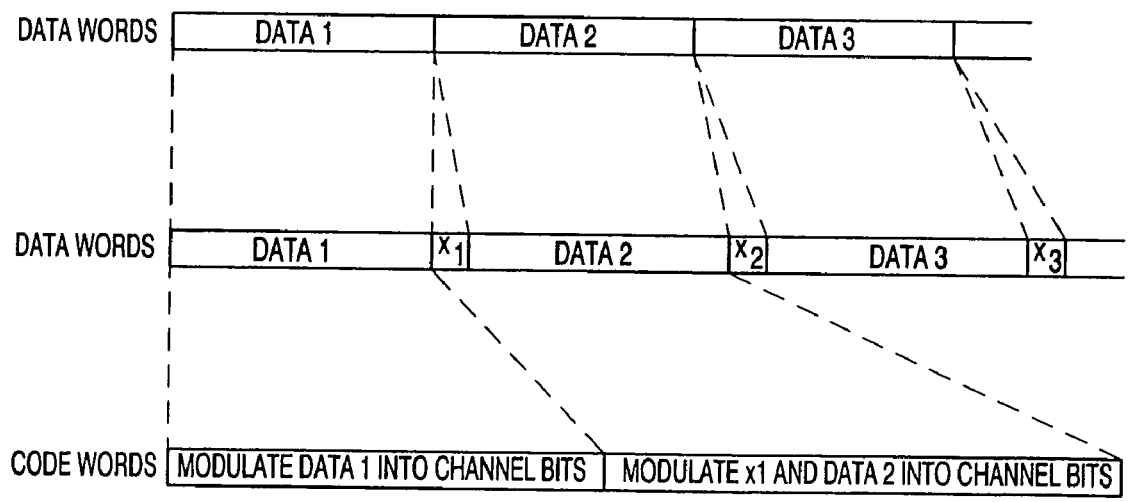
FIG. 2 is an explanatory diagram used for describing processing carried out by a DSV control bit determining/inserting unit 11 employed in the modulation apparatus shown in FIG. 1.
Figure 3:
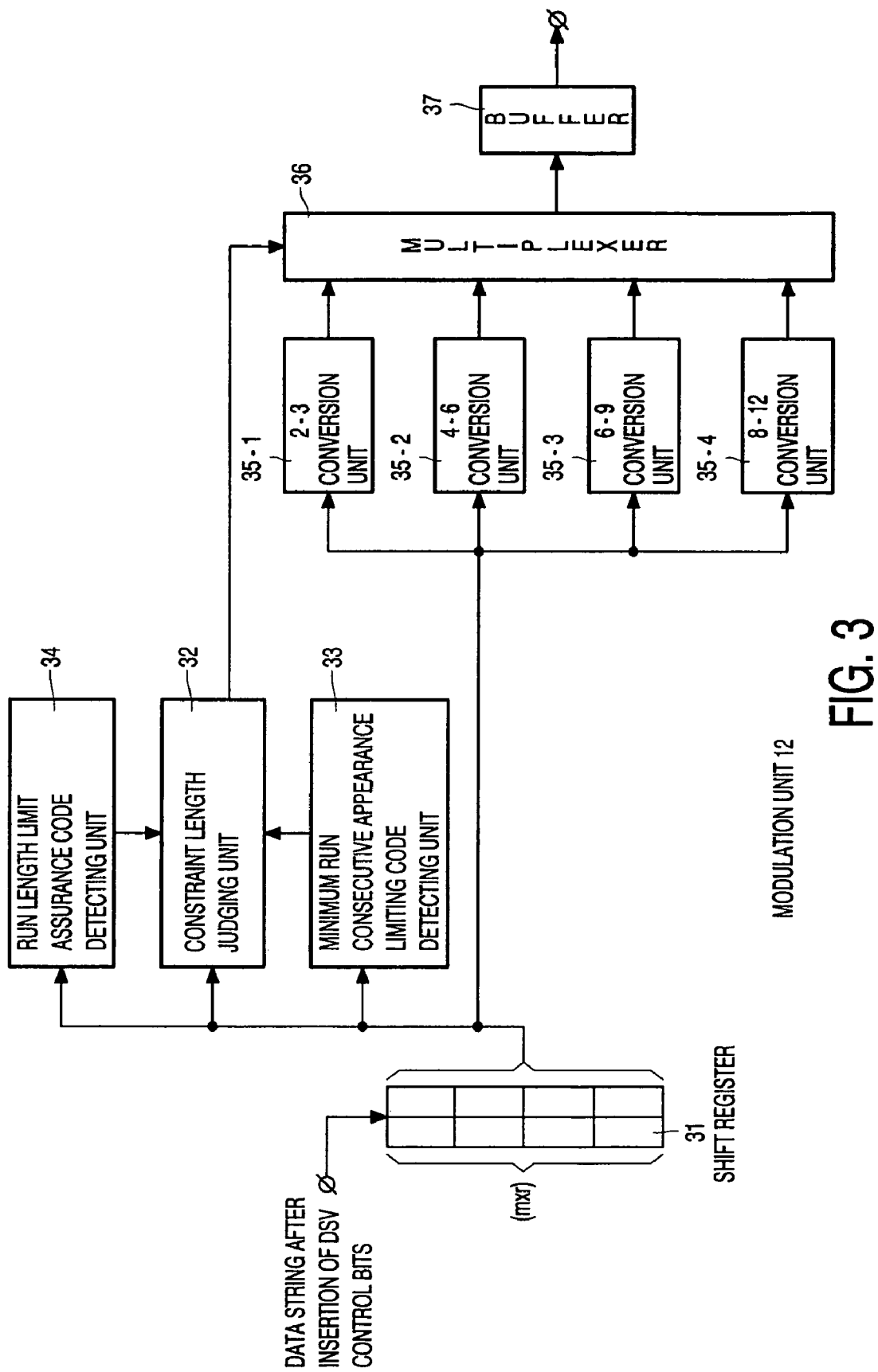
FIG. 3 is a block diagram showing a typical configuration of a modulation unit 12 employed in the modulation apparatus shown in FIG. 1.
Figure 4:
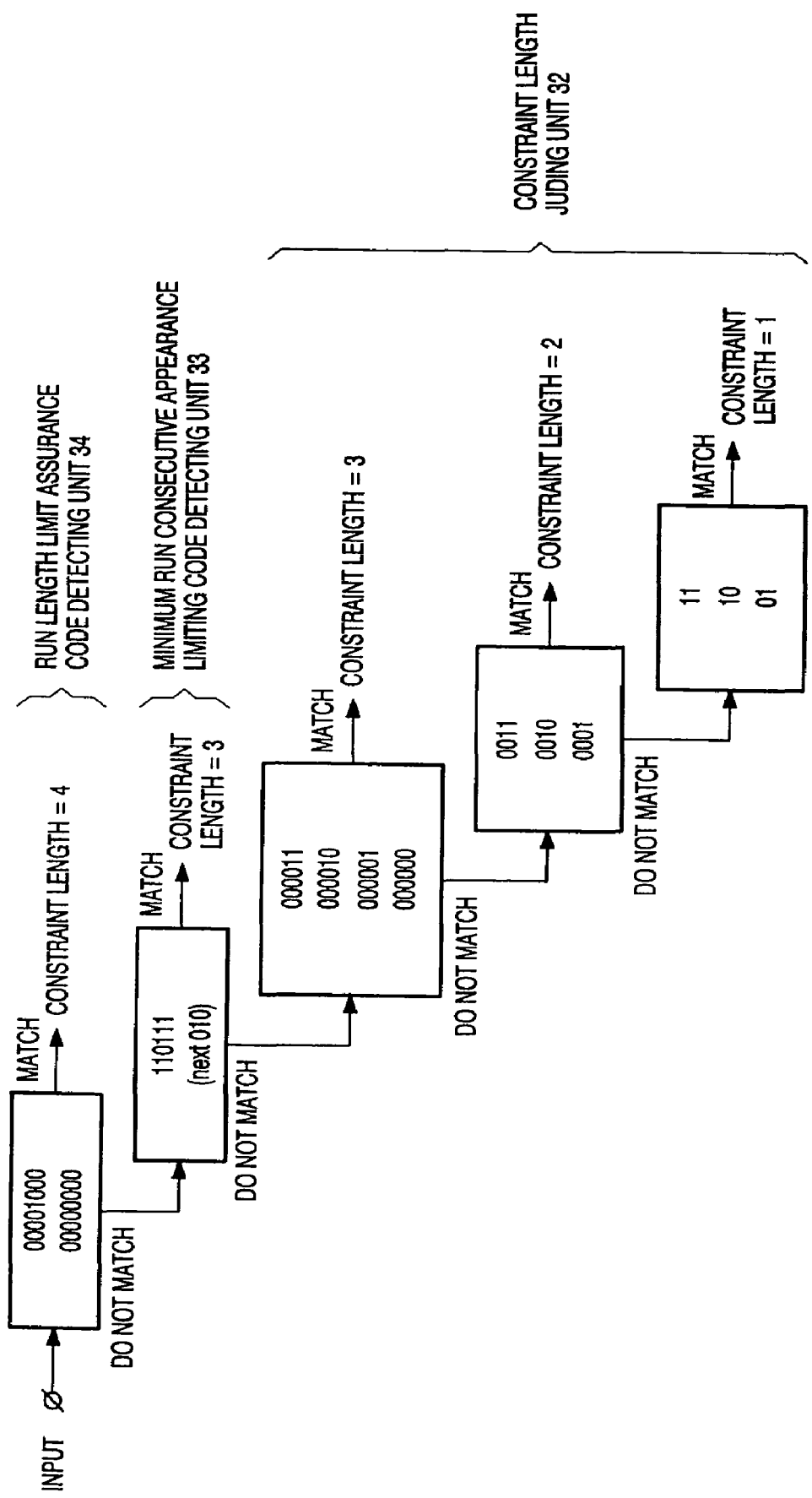
FIG. 4 is a diagram exemplifying processing carried out by the modulation unit 12 shown in FIG. 3.
Figure 5:
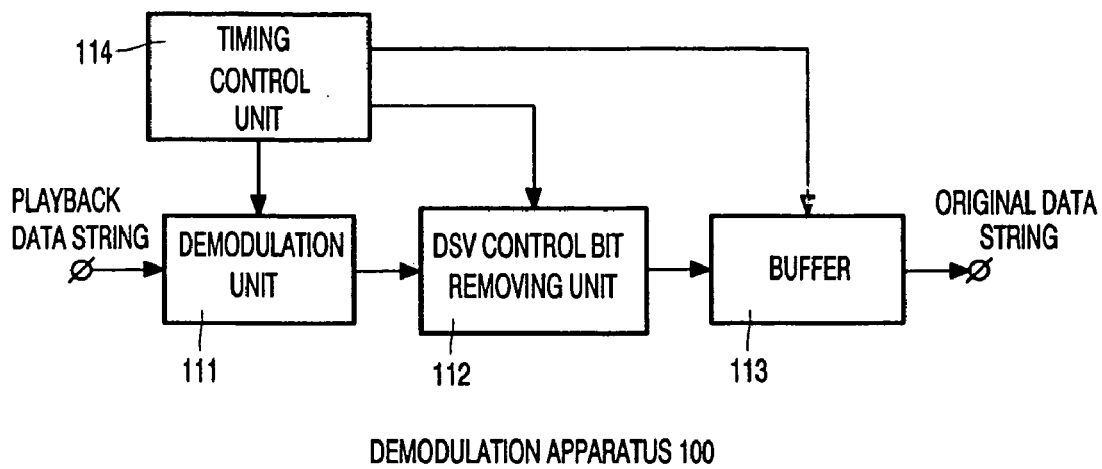
FIG. 5 is a block diagram showing a typical configuration of an embodiment implementing a demodulation apparatus provided by the present invention.
Figure 6:
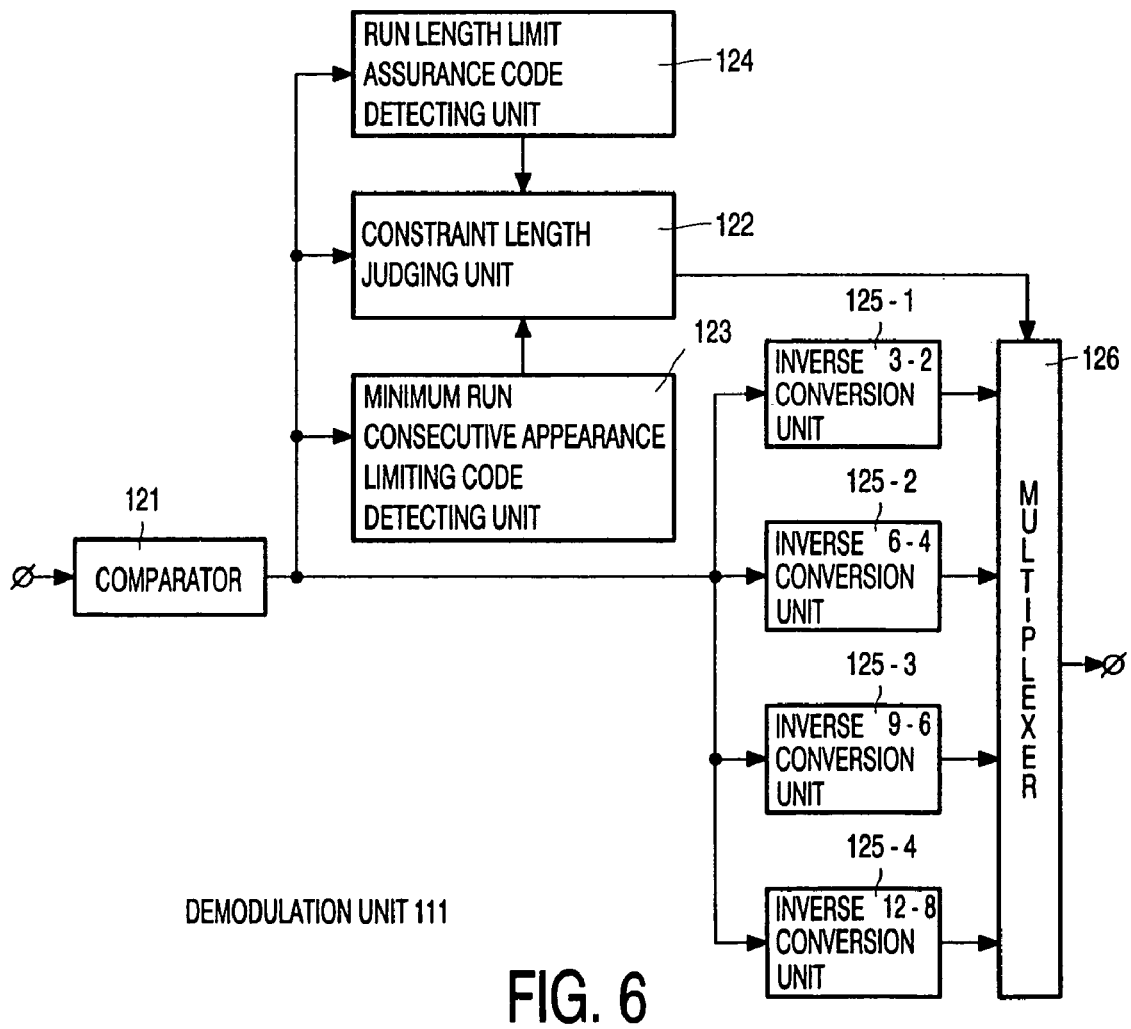
FIG. 6 is a block diagram showing a typical configuration of a demodulation unit 111 employed in the demodulation apparatus shown in FIG. 5.
Figure 7:
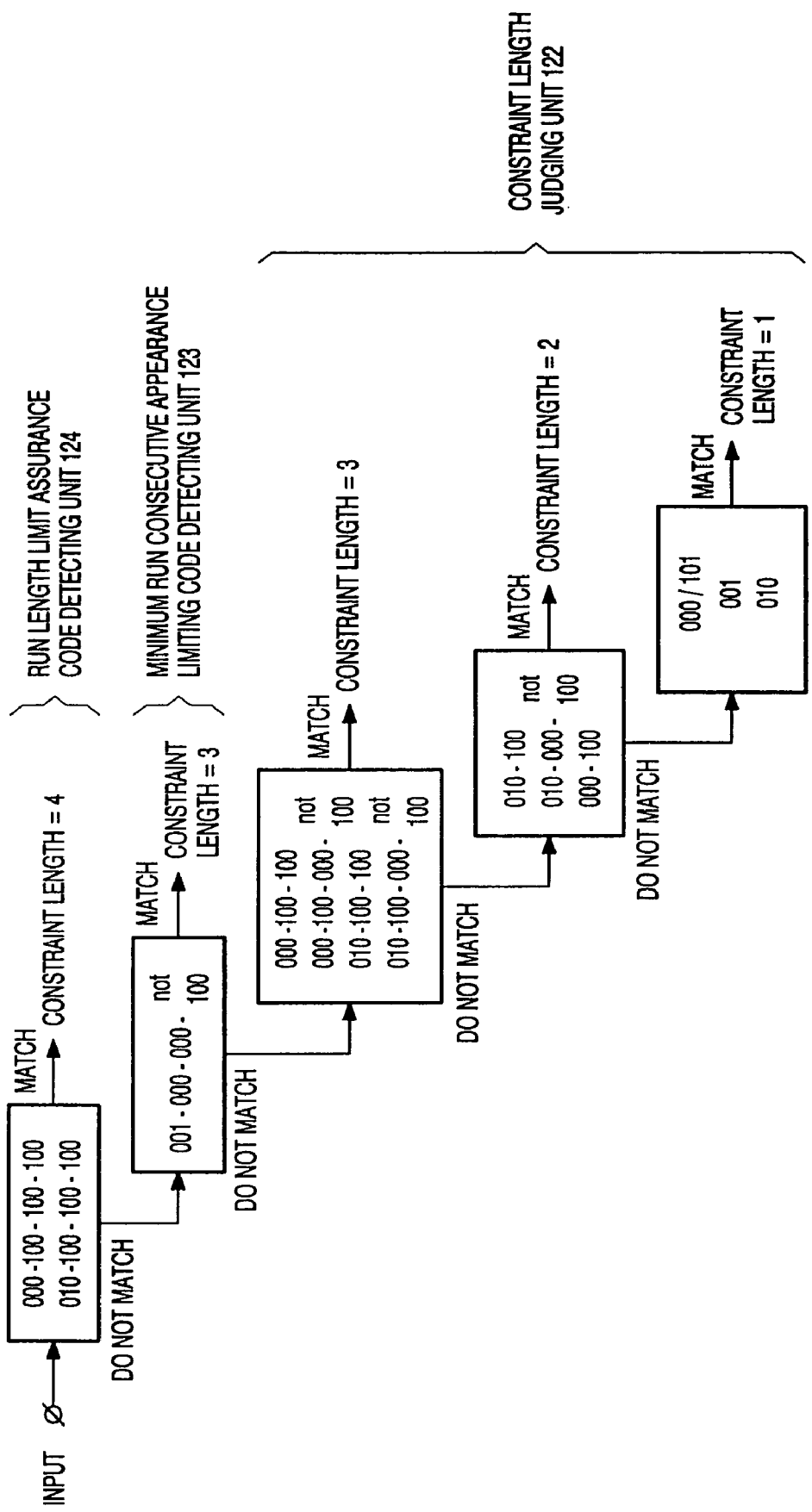
FIG. 7 is an explanatory diagram used for describing processing carried out by the demodulation unit 111 shown in FIG. 6.
Figure 8:
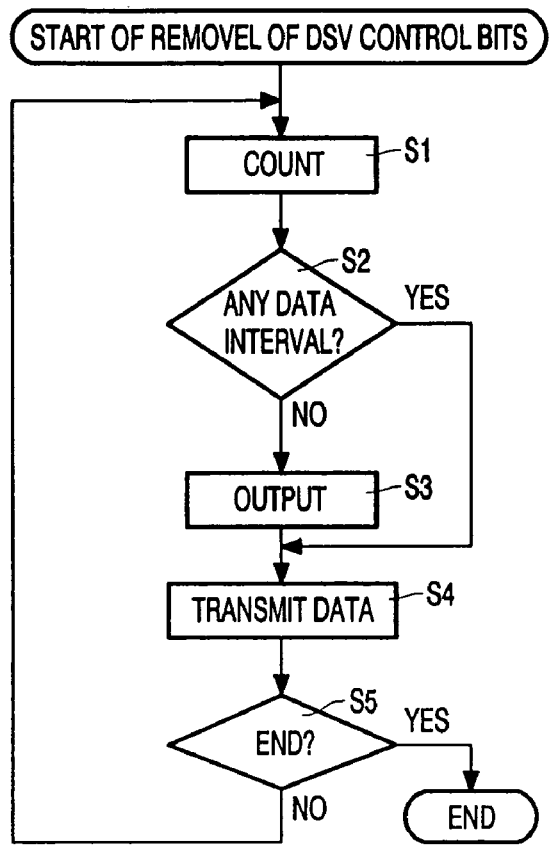
FIG. 8 is a flowchart used as a reference in explanation of operations carried out by a DSV control bit removing unit 112 employed in the demodulation apparatus shown in FIG. 5.
Figure 9:
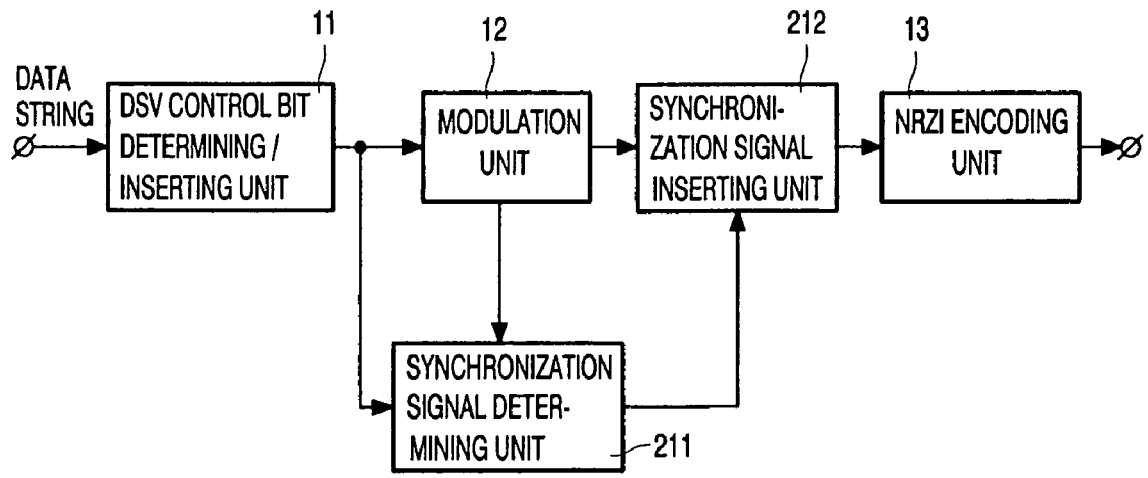
FIG. 9 is a block diagram showing another typical configuration of an embodiment implementing a modulation apparatus provided by the present invention.
Figure 10:
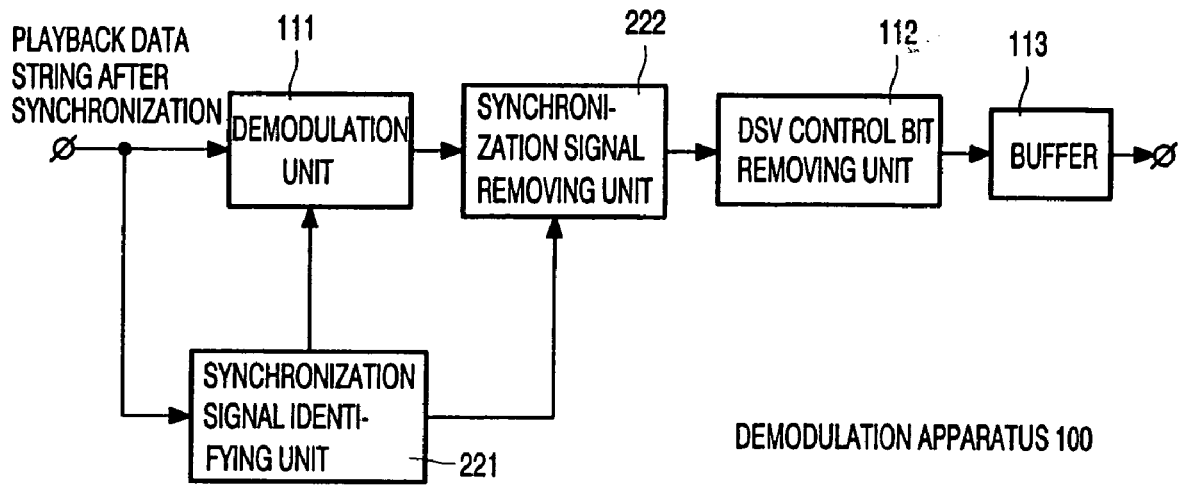
FIG. 10 is a block diagram showing another typical configuration of an embodiment implementing a demodulation apparatus provided by the present invention.
Figure 11:
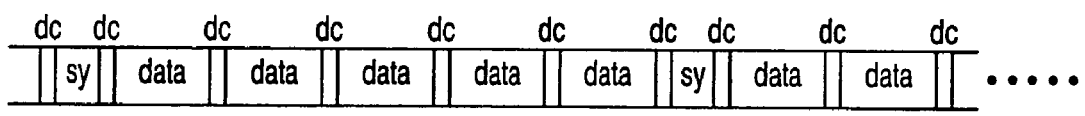
FIG. 11 is a diagram showing an example of code for recording with synchronization signals and DSV control bits inserted into it.

| LIST OF PRINCIPAL REFERENCE NUMERALS | |
|---|---|
| 11 | DSV control bit determining/inserting unit |
| 12 | Modulation unit |
| 13. | NRZI encoding unit |
| 31 | Shift register |
| 32 | Constraint length judging unit |
| 33 | Minimum run consecutive appearance limiting code detecting unit |
| 34 | Run length limit assurance code detecting unit |
| 35-1 to 35-4 | Conversion units |
| 36 | Multiplexer |
| 37 | Buffer |
| 111 | Demodulation unit |
| 112 | DSV control bit removing unit |
| 121 | Comparator |
| 122 | Constraint length judging unit |
| 123 | Minimum run consecutive appearance limiting code detecting unit |
| 124 | Run length limit assurance code detecting unit |
| 125-1 to 125-4 | Inverse conversion units |
| 126 | Multiplexer |

The invention claimed is:

1. A modulation apparatus for converting data into variable length strings of channel bits that are NRZI representations of logical code words in which d is a minimum run length and k is a maximum run length limit of '0' bits, said modulation apparatus having conversion means for converting input data into code in accordance with a conversion table wherein said conversion table enforces a conversion rule, according to which the remainder of division of a '1' count of an element in a data string by 2 having a value of 0 or 1 shall always be equal to the remainder of division of a '1' count of an element in the string of code words resulting from conversion of said data string by 2 and conversion codes of said conversion table comprise:

basic codes;

first substitution codes used when the basic codes fail to maintain the minimum run length d; and second substitution codes used when the basic codes fail to maintain the maximum run length limit k.

2. A modulation apparatus according to claim 1 characterized in that there are four basic codes that each convert two bit strings of data into three bit strings of channel bits.

3. A modulation apparatus according to claim 1 characterized in that said basic codes of said conversion tables have a variable length structure.

4. A modulation apparatus according to claim 1 characterized in that said basic codes of said conversion tables include a code '*0*' wherein the symbol * is an indeterminate code which is '0' if an immediately preceding or succeeding code word is '1' and '1' if said immediately preceding or succeeding code word is '0', implying that said code '*0*' is either '000' or '101'.

5. A modulation apparatus according to claim 1 characterized in that said conversion codes of said conversion tables include codes each determined by referring to an immediately succeeding string of code words or an immediately succeeding data string.

6. A modulation apparatus according to claim 1 characterized in that said conversion codes of said conversion tables include codes each determined by referring to an immediately succeeding string of code words or a string of code words of a specific type.

7. A modulation apparatus according to claim 5 characterized in that said codes each determined by referring to an immediately succeeding string of code words or an immediately succeeding data string is said first or second substitution codes.

8. A modulation apparatus according to claim 1 characterized in that the number of pairs each comprising a data string and a code string composing said basic codes for a constraint length i of 1 is equal to 4 (=2^m=2^2).

9. A modulation apparatus according to claim 1 characterized in that, for constraint lengths i of 2 and greater, said conversion codes are all said first and second substitution codes.

10. A modulation apparatus according to claim 1 characterized in said conversion codes for a constraint length i of 2 are codes for keeping said minimum run d at 1.

11. A modulation apparatus according to claim 1 characterized in that said conversion codes of said conversion tables include codes each determined by referring to an immediately preceding string of code words.

12. A modulation apparatus according to claim 1 characterized in that said apparatus further has a synchronization signal inserting means for inserting a synchronization signal including a unique pattern not included in said conversion codes of said conversion table into any arbitrary position in said string of code words.

13. A modulation apparatus according to claim 10 characterized in that said unique pattern is a pattern that breaks said maximum run k.

14. A modulation apparatus according to claim 10 characterized in that said unique pattern is a pattern that keeps said minimum run d.

15. A modulation apparatus according to claim 10 characterized in that a unique pattern in said synchronization signal comprises 1 code word at the head thereof serving as a connection bit with a code word resulting from conversion of up to immediately preceding data, a second bit for keeping said minimum run d and a third bit.

16. A modulation apparatus according to claim 10 characterized in that said synchronization signal is at least 12 code words in size.

17. A modulation apparatus according to claim 10 characterized in that, for a synchronization signal of at least 21 code words in size, said synchronization signal includes at least 2 patterns with a maximum run k of 8.

18. A modulation apparatus according to claim 10 characterized in that said conversion codes of said conversion table include termination codes each for terminating said code resulting from conversion.

19. A modulation apparatus according to claim 16 characterized in that said termination codes are prescribed for said basic codes with a constraint length i, for which the number of pairs each comprising a data string and a code string composing said basic codes is smaller than 4 (=2^m=2^2), and enforce a conversion rule, according to which the remainder of division of a '1' count of an element in a data string by 2 having a value of 0 or 1 shall always be equal to the remainder of division of a '1' count of an element in the string of code words resulting from conversion of said data string by 2.

20. A modulation apparatus according to claim 16 characterized in that, in order to identify said termination code, 1 code word at the head of said synchronization signal pattern serving as a connection bit is set at '1' when said termination code is used and at '0' when said termination code is not used.

21. A modulation apparatus according to claim 10 characterized in that said unique pattern is sandwiched by 3 bits at the head of said synchronization signal and 3 bits at the tail of said synchronization signal and said 3 bits at said head and 3 bits at said tail are each used as a junction comprising mixed data and connection bits.

22. A modulation apparatus according to claim 10 characterized in that:
the leading first one of 3 bits at the head of said synchronization signal has a value representing data words prior to conversion viewed in m-bit units;
the next second one of said 3 bits is set at '1' to prescribe said synchronization signal;
the leading first one of 3 bits at the tail of said synchronization signal is set at '0' to prescribe said synchronization signal; and
the next second one of said 3 bits at said tail has a value representing said data words prior to conversion viewed in m-bit units.

23. A modulation apparatus according to claim 1 characterized in that said apparatus further has DSV control means for controlling a DSV of input data and supplying said DSV to said conversion means.

24. A modulation apparatus according to claim 1 characterized in that said conversion means comprises:
a first code detecting means for detecting said first substitution codes for limiting the number of consecutive appearances of said minimum run d; and
a second code detecting means for detecting said second substitution codes for keeping run length limit.

25. A modulation method to be adopted in a modulation apparatus for converting data into variable length strings of channel bits that are NRZI representations of logical code words in which d is a minimum run length and k is a maximum run length limit of '0' bits, said modulation method including a converting input data into strings of channel bits in accordance with a conversion table wherein said conversion table enforces a conversion rule, according to which the remainder of division of a '1' count of an element in a data string by 2 having a value of 0 or 1 shall always be equal to the remainder of division of a '1' count of an element in the string of code words resulting from conversion of said data string by 2 and conversion codes of said conversion table comprise:
basic codes for;
first substitution codes used when the basic codes fail to maintain the minimum run length d; and
second substitution codes used when the basic codes fail to maintain the maximum run length limit k.

26. A program presenting medium for presenting a program implementing processing including a conversion step of converting input data into code in accordance with a conversion table data in a modulation apparatus for converting data with a basic data length of m bits into variable length code (d, k; m, n; r) with a basic code length of n bits where d is a minimum run and k is a run length limit, said program presenting medium characterized in that said conversion table enforces a conversion rule, according to which the remainder of division of a '1' count of an element in a data string by 2 having a value of 0 or 1 shall always be equal to the remainder of division of a '1' count of an element in the string of code words resulting from conversion of said data string by 2 and conversion codes of said conversion table comprise:
basic codes for d=1, k=7, m=2 and n=3;
first substitution codes for limiting the number of consecutive appearances of said minimum run d; and second substitution codes for keeping said run length limit k.

27. A demodulation apparatus for converting variable length code (d, k; m, n; r) with a basic code length of n bits into data with a basic data length of m bits where d is a minimum run and k is a run length limit, said demodulation apparatus characterized by having conversion means for converting input code into data in accordance with a conversion table wherein said conversion table enforces a conversion rule, according to which the remainder of division of a '1' count of an element in a data string by 2 having a value of 0 or 1 shall always be equal to the remainder of division of a '1' count of an element in the string of code words resulting from conversion of said data string by 2 and conversion codes of said conversion table comprise:

basic codes for d=1, k=7, m=2 and n=3;
first substitution codes for limiting the number of consecutive appearances of said minimum run d; and
second substitution codes for keeping said run length limit k.

28. A demodulation apparatus according to claim 25 characterized in that said apparatus further has a bit removing means for removing redundant bits inserted at predetermined intervals into said code.

29. A demodulation apparatus according to claim 26 characterized in that said redundant bits are DSV bits or synchronization signals.

30. A demodulation method to be adopted in a demodulation apparatus for converting variable length code (d, k m, n; r) with a basic code length of n bits into data with a basic data length of m bits where d is a minimum run (and k is a run length limit?), said modulation method characterized by having a conversion step of converting input code into data in accordance with a conversion table wherein said conversion table enforces a conversion rule, according to which the remainder of division of a '1' count of an element in a data string by 2 having a value of 0 or 1 shall always be equal to the remainder of division of a '1' count of an element in the string of code words resulting from conversion of said data string by 2 and conversion codes of said conversion table comprise:

basic codes for d=1, k=7, m=2 and n=3;
first substitution codes for limiting the number of consecutive appearances of said minimum run d; and
second substitution codes for keeping said run length limit k.

31. A program presenting medium for presenting a program including a conversion step of converting input code into data in accordance with a conversion table in a demodulation apparatus for converting variable length code (d, k; m, n; r) with a basic code length of n bits into data with a basic data length of m bits where d is a minimum run and k is a run length limit, said program presenting medium characterized in that said conversion table enforces a conversion rule, according to which the remainder of division of a '1' count of an element in a data string by 2 having a value of 0 or 1 shall always be equal to the remainder of division of a '1', count of an element in the string of code words resulting from conversion of said data string by 2 and conversion codes of said conversion table comprise:

basic codes for d=1, k=7, m=2 and n=3;
first substitution codes for limiting the number of consecutive appearances of said minimum run d; and
second substitution codes for keeping said run length limit k.

32. The modulation apparatus of claim 1 wherein said basic codes of said conversion table include a code '*0*' and wherein the symbol * in '*0*' stands for '0' if an immediately preceding code bit is '1' and stands for '1' if said immediately preceding code bit is '0', such that said code '*0*' is either '000' or '101'.

33. The modulation apparatus of claim 1, wherein said conversion codes of said conversion table include codes each determined by referring to an immediately succeeding string of code words or an immediately succeeding data string.

34. The modulation apparatus of claim 31, wherein data "11 01 11" is always converted to code bits "001 000 000" when the next portion of data are converted to code bits beginning with "010".

35. The modulation apparatus of claim 1, wherein:
the basic codes are:
"11" is converted to "*0*" where "*" is "1" when the last bit of the preceding code word is "1" and "*" is "0" when the last bit of the preceding code word is "001";
"10" is converted to "001";
01" is converted to "010";
"00 11" is converted to "010 100";
"00 10" is converted to "010 000":
"00 01" is converted to "000 100";
"00 00 11" is converted to "000 100 100";
"00 00 10" is converted to "000 100 000";
"00 00 01" is converted to "010 100 100";
"00 00 00" is converted to "010 100 000";
the first substitution codes are:
"11 01 11" is converted to "001 000 000" only when the following code word is "010";
the second substitution codes are:
"00 00 10 00" is converted to "000 100 100 100";
"00 00 00 00" is converted to "010 100 100 100".

* * * * *